(12) United States Patent
Orimo et al.

(10) Patent No.: US 6,909,558 B2
(45) Date of Patent: Jun. 21, 2005

(54) LENS CENTERING MECHANISM, LENS APPARATUS AND IMAGING APPARATUS

(75) Inventors: Shinichi Orimo, Kanagawa (JP); Hiroyuki Mori, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/662,903

(22) Filed: Sep. 15, 2003

(65) Prior Publication Data

US 2004/0109243 A1 Jun. 10, 2004

(30) Foreign Application Priority Data

Sep. 25, 2002 (JP) .................................... P2002-279625
Apr. 18, 2003 (JP) .................................... P2003-114914

(51) Int. Cl.[7] .......................... G02B 15/14; G02B 7/02; G03B 21/14

(52) U.S. Cl. ........................ 359/694; 359/699; 359/813; 359/819; 359/823; 353/101

(58) Field of Search ................................ 359/694, 699, 359/813, 819, 822, 823, 804; 353/100, 101

(56) References Cited

U.S. PATENT DOCUMENTS

| 5,210,644 | A | * | 5/1993 | Nomura | 359/694 |
| 5,225,938 | A | * | 7/1993 | Nomura | 359/699 |
| 5,537,262 | A | * | 7/1996 | Aoki et al. | 359/822 |
| 6,400,516 | B1 | * | 6/2002 | Spinali | 359/819 |
| 6,547,402 | B2 | * | 4/2003 | Masuda | 353/101 |
| 6,614,601 | B2 | * | 9/2003 | Dallakian | 359/804 |

* cited by examiner

Primary Examiner—Loha Ben
(74) Attorney, Agent, or Firm—Jay H. Maioli

(57) ABSTRACT

A lens held by a lens holding member is centered easily and correctly by a mechanism in which a guide pin is inserted into a guide hole for positioning the lens holding member with respect to the main body unit of the lens barrel in a plane perpendicular to the optical axis of the lens and for mounting the lens holding member for movement in a direction along the optical axis. Adjustment pins are rotationally mounted on at least three sites on the outer peripheral surface of the main body unit of the lens barrel. If each adjustment pin is rotated, an offset portion of the adjustment pin which is relative to the center of rotation of the adjustment pin, is rotated, as the offset portion is engaged in an engagement hole of the lens holding member. In this way the lens holding member on each site is displaced in the direction along the optical axis to adjust the tilt of the lens held by the lens holding member.

33 Claims, 18 Drawing Sheets

LENS CENTERING MECHANISM, LENS APPARATUS AND IMAGING APPARATUS

BACKGROUND OF THE INVENTION

1. Field of the Invention

This invention relates to a lens centering mechanism for centering a lens when a lens holding member holding a lens is mounted to a main body unit of a lens barrel, a lens apparatus, and to an imaging apparatus having such lens centering mechanism.

2. Description of Related Art

Up to now, there have been used lens apparatus in which an image of an object is formed by plural lenses arranged in a main body unit of the lens barrel as optical axes thereof are aligned with one another. There have also been used imaging apparatus, such as a digital still camera or a digital video camera, for receiving an image of an object, formed by such lens apparatus, by a solid-state imaging device, such as a CCD (charge-coupled device) or CMOS (complementary metal-oxide semiconductor) device, and for outputting electrical signals, obtained on photo-electric conversion of light received by the solid-state imaging device, in order to generate digital image data corresponding to the object image.

Among the lens apparatus, there is such an apparatus in which certain ones of plural lenses, arranged in the main body unit of the lens barrel, are held by a lens holding member, and in which there is provided a lens centering mechanism for centering the lenses when the lens holding member is mounted to the main body unit of the lens barrel (see for example References Cited 1 to 3).

For example, a lens apparatus 200, shown in FIG. 1, is provided with a lens centering mechanism in which, when mounting a lens holding member 202 on the front side of a main body unit of the lens barrel 201, a plural number of plate springs 205 and coil springs, not shown, are interposed between a corresponding plural number of tapped holes 203, provided in a mounting surface of a main body unit of the lens barrel 201, and a corresponding plural number of through-holes 204, provided in a mounting surface of the lens holding member 202, and a plural number of set screws 206 are inserted in the tapped holes 203, through the through-holes 204 and the plate springs 205, from the front surface of the lens holding member 202, with the tightening of the set screws 206 being then adjusted to adjust the tilt of a lens 207 held by the lens holding member 202.

On the other hand, a lens apparatus 300, shown in FIG. 24, is provided with a lens centering mechanism in which a toroidally-shaped plate spring 303 is secured to a main body unit of the lens barrel 301, a plural number of guide projections 307, provided to the outer rim of a lens holding member 306, are engaged in a corresponding plural number of guide holes formed in the outer rim of a lens holding member 306, and in which, as the lens holding member 306 is held by the plate spring 303, a corresponding plural number of adjustment screws 309 are tightened in a corresponding plural number of tapped holes 308 formed in the front surface of the lens holding member 306 to cause the adjustment screws 309 to be variably protruded towards the plate springs 303 to adjust the tilt of a lens 310 held by the lens holding member 306. On the outer rim of the lens holding member 306, there is provided a sealant rubber piece 302 for prohibiting intrusion of dust and dirt from outside.

Reference Cited 1: Japanese Laying-Open Patent Publication H11-160749.
Reference Cited 2: Japanese Laying-Open Patent Publication H2-113214.
Reference Cited 3: Japanese Laying-Open Patent Publication 2002-196205.

However, with the above-described lens apparatus 200 and 300, the lens centering mechanism takes up relatively large space portions on the outer rim of the main body unit of the lens barrel and the lens holding member. In particular, on the front surface side of the main body unit of the lens barrel, the outer shape of the main body unit of the lens barrel is significantly swollen out with respect to the lens held by the lens holding member, thus leading to a significant demerit in reducing the overall size of the apparatus.

With the above-described lens apparatus 200, 300, the tilt of the lens, held by the lens holding member, is adjusted as an image of a chart is formed on a CCD and, as the image of the chart, picked up by the CCD, is observed on a monitor. However, with these lens apparatus 200, 300, in which the set screws or adjustment screws are tightened in a direction parallel to the optical axis, from a position proximate to the front side lens of the lens holding member, an image of a jig for tightening the screws or the operator=s hand tends to be taken into an image of the chart at the time of adjustment, thus obstructing the centering operation.

On the other hand, with the above-described lens apparatus 200, 300, in which the set screws or the adjustment screws are mounted in a direction towards the optical axis, at the time of adjustment, these screws tend to be intruded into the inside of the main body unit of the lens barrel, thus giving rise to a risk of the image of the component parts being taken into the chart image. Moreover, with the above-described lens apparatus 300, the adjustment screws 309 for adjusting the tilt of the lens 310 is needed in addition to the set screws 304, thus increasing the number of the component parts.

On the other hand, if, as described in the Reference Cited 1, the lens tilt is adjusted as offset pins provided at two outer peripheral points are rotated, with a reference pin provided at a point on the outer rim as a fulcrum point, the lens is displaced in its entirety in a direction towards the optical axis, thus possibly affecting the optical performance. In addition, with the offset pins fitted in elongated holes, it is necessary to provide a clearance, from the aspect of designing, with the result that the overall lens may possibly suffer from backlash.

If, as described in the above Reference Cited 2, the movable lens barrel is to be moved by a conjoint operation of a guide groove formed in a guide tube, a cam groove formed in a cam cylinder and a cam pin provided at a point of intersection of the guide groove and the cam groove, the cam pin is fixedly threaded to the movable lens barrel, thus leading to significant demerit in reducing the number of component parts and the number of operating steps. On the other hand, the tilt of the lens held by the movable lens barrel is adjusted by rotating the cam pin about a center axis of a second radial portion fitted in the guide groove and in the cam groove and which is offset relative to the first radial portion. In this case, at least two portions of the guide groove and the cam groove need to be fitted in order to hold the second radial portion of the cam pin operating as reference for tilt adjustment. Moreover, there is no limitation imposed on the rotation about the optical axis of the movable lens barrel, thus giving rise to a risk that the lens not only tends to be shifted along the optical axis but also tends to be rotated about its optical axis. There is also a risk that, except if the cam pin is fixed after adjustment, the cam pin tends to be rotated during use such that it becomes impossible to maintain the adjusted state.

On the other hand, if a spring washer, as a member responsible for biasing a lens holding frame, is mounted in the form of a flange, that is so that the spring washer is larger in diameter than the outer rim of the lens holding frame, as in the case of the Reference Cited 3, the overall apparatus cannot readily be reduced in size. Additionally, the number of component parts is increased because a thrusting mechanism for thrusting the spring washer by a screw and an adjustment mechanism by the offset pins are separated from each other.

SUMMARY OF THE INVENTION

In view of the above depicted state of the related art, it is an object of the present invention to provide a lens centering mechanism which enables facilitated and optimized centering of the lens held by the lens holding member.

It is another object of the present invention to provide a lens apparatus in which, by facilitated optimized centering of the lens held by the lens holding member, the optical performance of each lens held by main body unit of the lens barrel may be maintained, and in which, by reducing the number of component parts and the number of the assembling steps, the apparatus may be further reduced in size and cost.

It is yet another object of the present invention to provide an imaging apparatus in which, by facilitated optimized centering of the lens held by the lens holding member, the optical performance of each lens held by the lens holding member may be maintained, and an image of an object formed by plural lenses may be optimally picked up by a solid-state imaging device, and in which, by reducing the number of component parts and the number of the assembling steps, the apparatus may be further reduced in size and cost.

For accomplishing the above object, the present invention provides a centering mechanism for a lens for centering the lens when a lens holding member holding the lens is mounted on a main body unit of the lens barrel. The centering mechanism for a lens includes support means for positioning the lens holding member with respect to the main body unit of the lens barrel within a plane perpendicular to the optical axis of the lens and for carrying the lens holding member for movement in a direction along the optical axis, and adjustment means including a plurality of adjustment members, rotationally mounted on at least three sites on the outer peripheral surface of the main body unit of the lens barrel, the adjustment members being rotated to displace the lens holding members in a direction along the optical axis for adjusting the tilt of the lens held by the lens holding member.

With the lens centering mechanism of the present invention, the support means positions the lens holding member with respect to the main body unit of the lens barrel in a plane perpendicular to the optical axis of the lens and, as the lens holding member is supported for movement in the direction along the optical axis, the adjustment means causes rotation of plural adjustment members, rotationally mounted on at least three sites of the outer peripheral surface of the main body unit of the lens barrel, in such a manner as to displace the lens holding member in the direction along the optical axis. This enables facilitated optimum adjustment of the tilt of the lens held by the lens holding member.

The present invention also provides a lens apparatus comprising a plurality of lenses for forming an image of an object, a lens holding member for holding at least one of the lenses, a main body unit of a lens barrel mounting the lens holding member, the main body unit of the lens barrel carrying the plural lenses mounted therein on a common optical axis, support means for positioning the lens holding member with respect to the main body unit of the lens barrel in a plane perpendicular to an optical axis of the lens and for carrying the lens holding member for movement in a direction along the optical axis, and adjustment means including a plurality of adjustment members, rotationally mounted on at least three sites on the outer peripheral surface of the main body unit of the lens barrel. The adjustment member is rotated to displace the lens holding members in a direction along the optical axis for adjusting the tilt of the lens held by the lens holding member.

With the lens apparatus of the present invention, the support means positions the lens holding member with respect to the main body unit of the lens barrel in a plane perpendicular to the optical axis of the lens and, as the lens holding member is supported for movement in the direction along the optical axis, the adjustment means causes rotation of plural adjustment members, rotationally mounted on at least three sites of the outer peripheral surface of the main body unit of the lens barrel, in such a manner as to displace the lens holding member in the direction along the optical axis. This enables facilitated optimum adjustment of the tilt of the lens held by the lens holding member, while keeping the optical performance of the plural lenses arranged on a common optical axis.

The present invention also provides an imaging apparatus lens apparatus comprising a plurality of lenses for forming an image of an object, a lens holding member for holding at least one of the lenses, a main body unit of a lens barrel mounting the lens holding member, the main body unit of the lens barrel carrying the plural lenses mounted therein on a common optical axis, support means for positioning the lens holding member with respect to the main body unit of the lens barrel in a plane perpendicular to an optical axis of the lens and for carrying the lens holding member for movement in a direction along the optical axis, and adjustment means including a plurality of adjustment members, rotationally mounted on at least three sites on the outer peripheral surface of the main body unit of the lens barrel, the adjustment member being rotated to displace the lens holding members in a direction along the optical axis for adjusting the tilt of the lens held by the lens holding member.

With the imaging apparatus of the present invention, the support means positions the lens holding member with respect to the main body unit of the lens barrel in a plane perpendicular to the optical axis of the lens and, as the lens holding member is supported for movement in the direction along the optical axis, the adjustment means causes rotation of plural adjustment members, rotationally mounted on at least three sites of the outer peripheral surface of the main body unit of the lens barrel, in such a manner as to displace the lens holding member in the direction along the optical axis. This enables facilitated optimum adjustment of the tilt of the lens held by the lens holding member, while keeping the optical performance of the plural lenses arranged on a common optical axis and enabling an image of an object formed by these lenses to be picked up satisfactorily by the imaging apparatus.

According to the present invention, the lens holding member may be displaced in a direction along the optical axis by rotating the plural adjustment members arranged on at least three sites on the outer peripheral surface of the main body unit of the lens barrel, in such a manner as to adjust the tilt of the lens held by the lens holding member. Thus, there is no risk of a jig or an operator=s hand, for example, being photographed in an image to assure facilitated centering operations. Moreover, e.g. the jig used in carrying out the centering operation may be simplified in structure.

Additionally, according to the present invention, the lens centering mechanism can be smaller in size than conventionally, such that the degree of swelling out of the outer shape of the main body unit of the lens barrel can be suppressed to a smallest possible value. Thus, with the lens apparatus and the imaging apparatus, having the lens centering mechanism, the size of the overall apparatus may be reduced.

According to the present invention, there is only little risk of e.g. set screws or the plate springs intruding into the inside of the main body unit of the lens barrel, so that there is no fear of component parts being picked up inadvertently. Since set screws for securing the lens holding member to the main body unit of the lens barrel or springs for biasing the lens holding member are not needed, the number of component parts or the number of process steps may be reduced to further reduce the cost.

DESCRIPTION OF THE PREFERRED EMBODIMENTS

Figure 1:
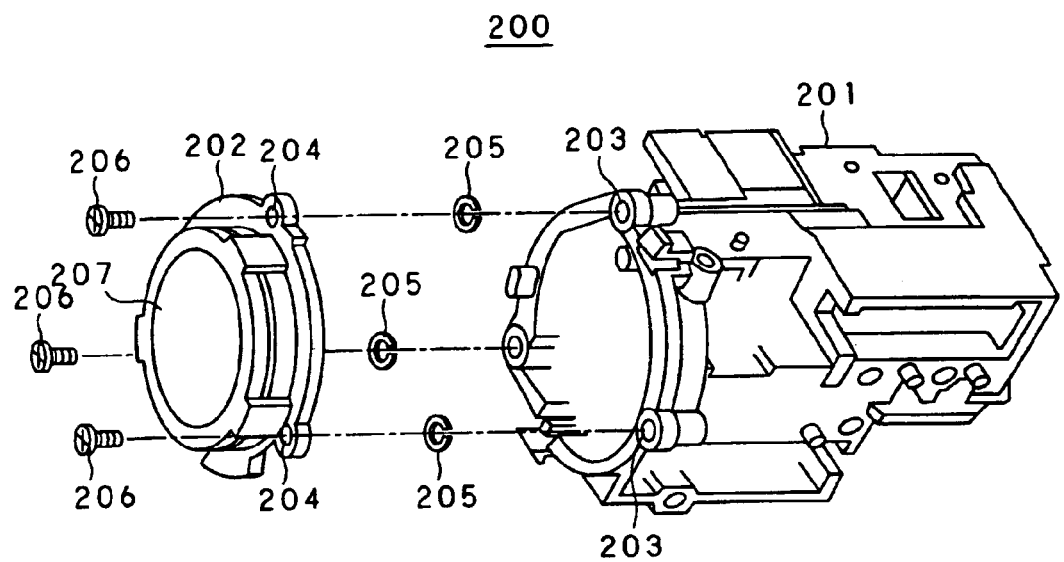
FIG. 1 is an exploded perspective view showing a typical lens centering mechanism provided to a conventional lens apparatus.
Figure 2:
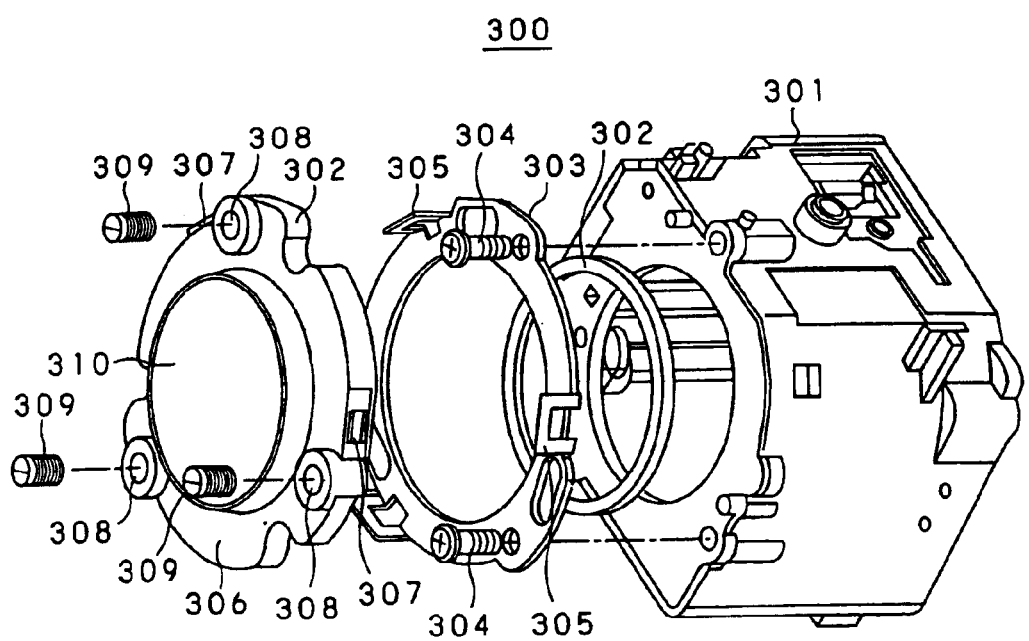
FIG. 2 is an exploded perspective view showing another typical lens centering mechanism provided to a conventional lens apparatus.

Referring to the drawings, a lens centering mechanism, a lens apparatus and an imaging apparatus, embodying the present invention, will be explained in detail.

Figure 3:
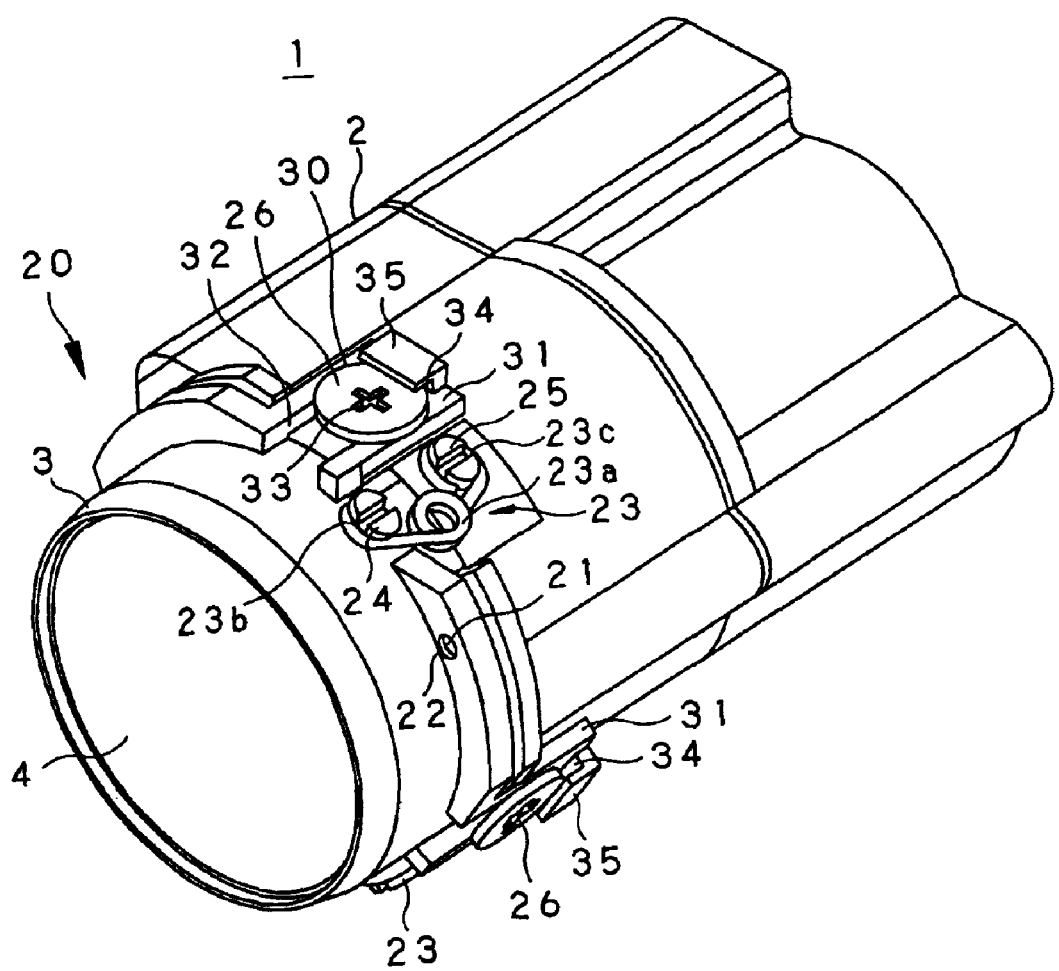
FIG. 3 is a perspective view showing the appearance of a lens apparatus embodying the present invention.

Referring first to FIG. 3, a lens apparatus 1, embodying the present invention, is a so-called lens barrel, configured for forming an image of an object by a plural number of lenses mounted on a common optical axis within a main body unit of the lens barrel 2. A solid-state imaging device for photographing an image of the object, formed by the plural number of lenses, is mounted on the back surface of the lens barrel, for constructing an imaging apparatus embodying the present invention.

Specifically, the main body unit of the lens barrel 2 is formed to substantially a cylindrical shape from a black resin material, exhibiting certain strength, mass-producibility and light shielding properties, for example, a polycarbonate resin containing glass fibers. On the front side of the main body unit of the lens barrel 2, there is mounted a lens holding member 3 for holding a lens which is to operate as a forward lens. The lens apparatus 1 also includes a lens centering mechanism 20 for centering the lens held by the lens holding member 3 as later explained.

Figure 4:
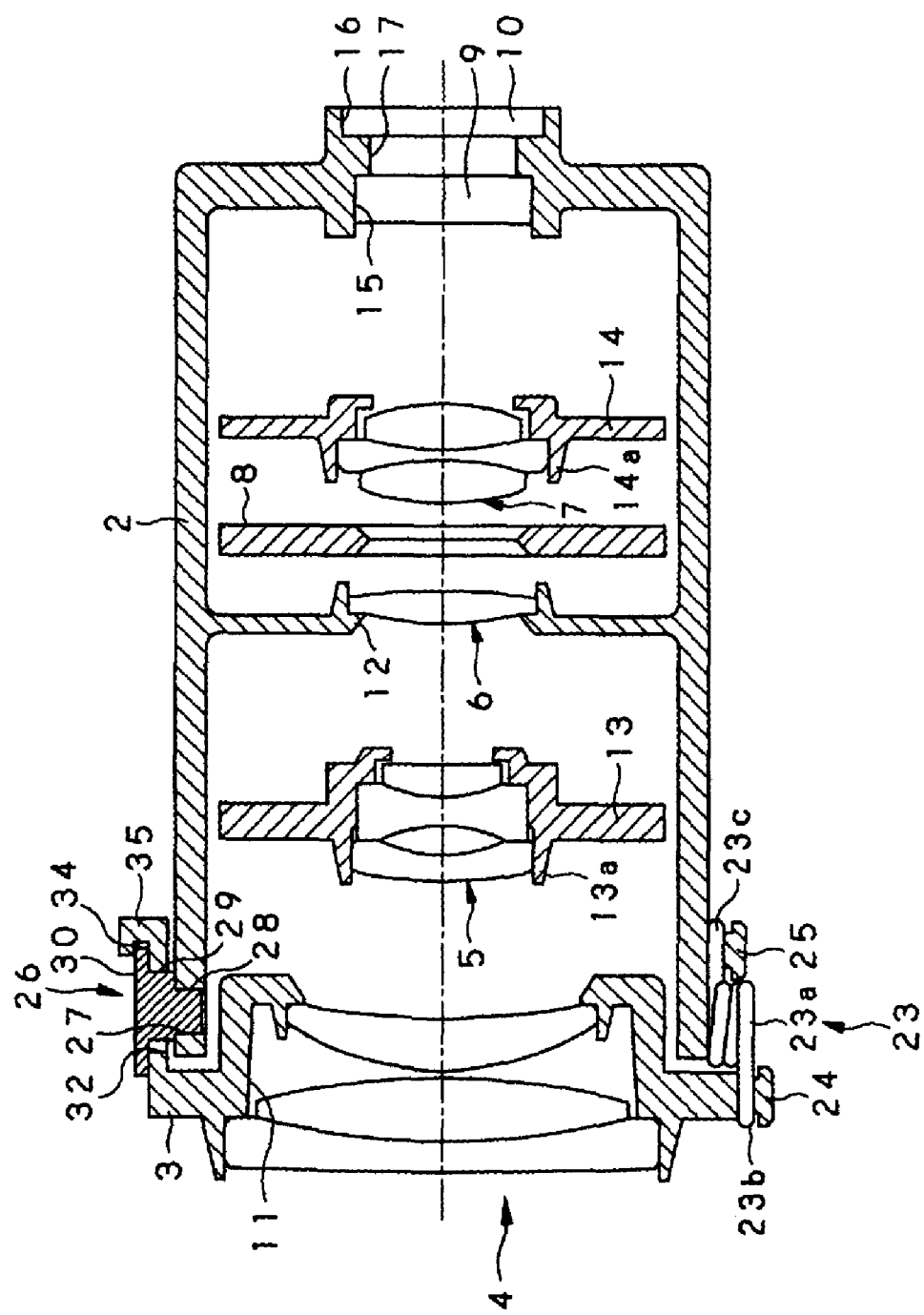
FIG. 4 is a cross-sectional view showing the structure of the lens apparatus.

Referring to FIG. 4, the plural lenses are comprised, looking from the object side, a first set of fixed lenses 4, secured to the lens holding member 3, a set of movable lenses for zooming 5, actuated for movement along the optical axis within the main body unit of the lens barrel 2, a second set of fixed lenses 6, secured to the main body unit of the lens barrel 2, and a set of movable lenses for focussing 7, actuated for movement along the optical axis within the main body unit of the lens barrel 2. That is, the plural lenses are constructed as a so-called four set inner focussing type zoom lenses.

An iris stop 8 is mounted between the second set of fixed lenses 6 and the set of movable lenses for focussing 7. On an image surface side of the object, the image of which is formed by the above plural lenses, that is on the back side of the main body unit of the lens barrel 2, there are mounted an optical filter 9, secured to the main body unit of the lens barrel 2, and a solid-state imaging device 10, as imaging means.

Of these, the first set of fixed lenses 4 is fixedly supported by the lens holding member 3 by having an outer rim held by a substantially cylindrically-shaped lens holding frame 11 provided to the lens holding member 3. The second set of fixed lenses 6 is fixedly supported by the main body unit of the lens barrel 2 by having an outer rim held by a substantially cylindrically-shaped lens holding frame 12 provided within the main body unit of the lens barrel 2. The set of movable lenses for zooming 5 and the set of movable lenses for focussing 7 are carried by a lens supporting mechanism for movement in a direction along the optical axis.

This lens supporting mechanism includes a lens supporting member for zooming 13, carrying the set of movable lenses for zooming 5, a lens supporting member for focussing 14, carrying the set of movable lenses for focussing 7, and a pair of guide shafts, not shown, carrying the lens supporting members 13, 14 for sliding along the optical axis.

The lens supporting member for zooming 13 and the lens supporting member for focussing 14 are each formed of a black resin material, exhibiting certain strength, mass-producibility and light shielding properties, and include lens holding frames 13a, 14a, respectively, carrying the outer rims of the sets of movable lenses 5, 7, respectively. The lens supporting members 13, 14 are provided with a pair of guide shafts, not shown, extending in the inside of the main body unit of the lens barrel 2 in a direction parallel to the optical axis. A tubular portion having a guide hole for passage by one of the guide shafts, and a support piece having a guide groove for holding the other guide shaft, are mounted for being protruded from opposite positions on the outer rim of the lens holding frames 13a, 14a. In this manner, the lens supporting member for zooming 13 and the lens supporting member for focussing 14 are carried for sliding along the paired guide shafts.

The main body unit of the lens barrel 2 also includes a lens driving mechanism for causing movement of the lens supporting member for zooming 13 and the lens supporting member for focussing 14 in a direction along the optical axis along the paired guide shafts. Although not shown, the lens driving mechanism actuates the lens supporting members 13, 14, carried by the paired guide shafts, in a direction along the optical axis, independently of each other, by the driving operation by a stepping motor or a linear motor, not shown.

The iris stop 8 is formed as one with an iris unit secured in position to the main body unit of the lens barrel 2. The iris unit is driven by a driving motor, not shown, for causing the sliding of two shutter members for adjusting the opening of the iris stop 8.

The optical filter 9 is comprised of an infrared cut-off filter for preventing the near infrared light from reaching the solid-state imaging device 10 and a low-pass cut-off filter for taking out specified spatial frequency components from light proceeding towards the solid-state imaging device 10.

The solid-state imaging device 10, photo-electrically transducing the incident light to output the resulting electrical signal, is comprised of semiconductor chips, such as CCDs (charge-coupled devices) or CMOS (complementary metal oxide semiconductor) devices, mounted on a wiring circuit board. On the back surface of the wiring circuit board, there are mounted plural connection terminals for supplying electrical signals, output from the semiconductor chip, to an external signal processing circuit.

A rear lens barrel, forming the back side of the main body unit of the lens barrel 2, is provided fitting recesses 15, 16 in which are fitted the optical filter 9 and the solid-state imaging device 10. In-between these fitting recesses 15, 16 is formed a rectangular-shaped through-hole 17 formed through the rear lens barrel. The optical filter 9 and the solid-state imaging device 10 are secured in position to the back surface of the main body unit of the lens barrel 2 by being fitted in the fitting recesses 15, 16.

In the above-described lens apparatus 1, focussing (focal point adjustment operation) of displacing the set of movable lenses for focussing 7 in a direction along the optical axis takes place as the set of movable lenses for zooming 5 is moved in a direction along the optical axis, by way of zooming (magnification varying), such that the image surface of the image of the object, formed by the plural lenses, is coincident with a light receiving surface of the solid-state imaging device 10, as later explained. This renders it possible to vary the focal length continuously, as the image surface of the image of the object, formed by the plural lenses, is kept coincident with the light receiving surface of the solid-state imaging device 10.

Figure 5:
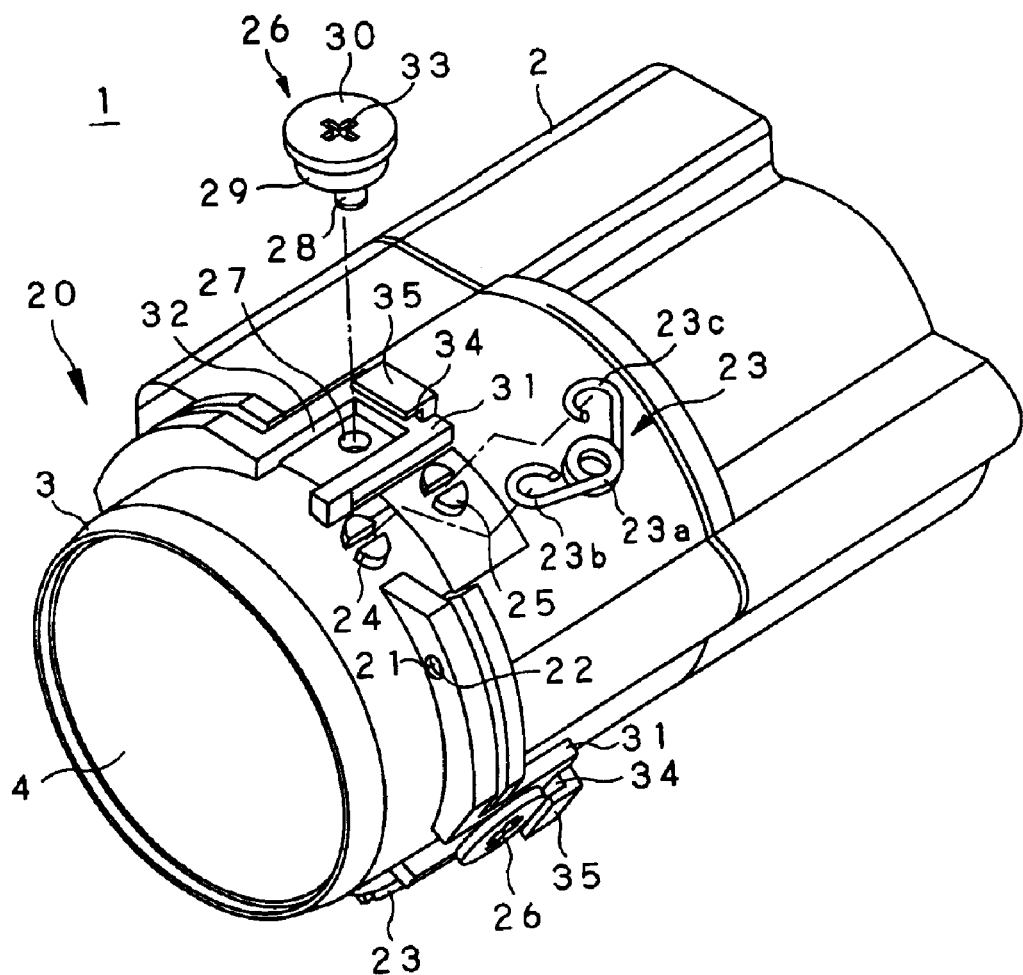
FIG. 5 is an exploded perspective view showing the structure of a lens centering mechanism provided to the lens apparatus.

It should be noted that the lens apparatus 1 includes a lens centering mechanism 20 for centering the first set of fixed lenses 4, held by the lens holding member 3, according to the present invention, as shown in FIGS. 3 and 5. Each lens of the first set of fixed lenses 4, is referred to simply below as >lens=.

Figure 6:
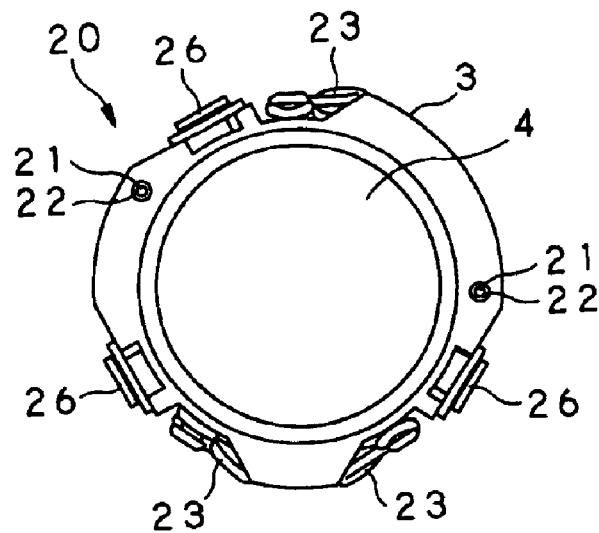
FIG. 6 is a front view showing the structure of the lens apparatus.
Figure 7:
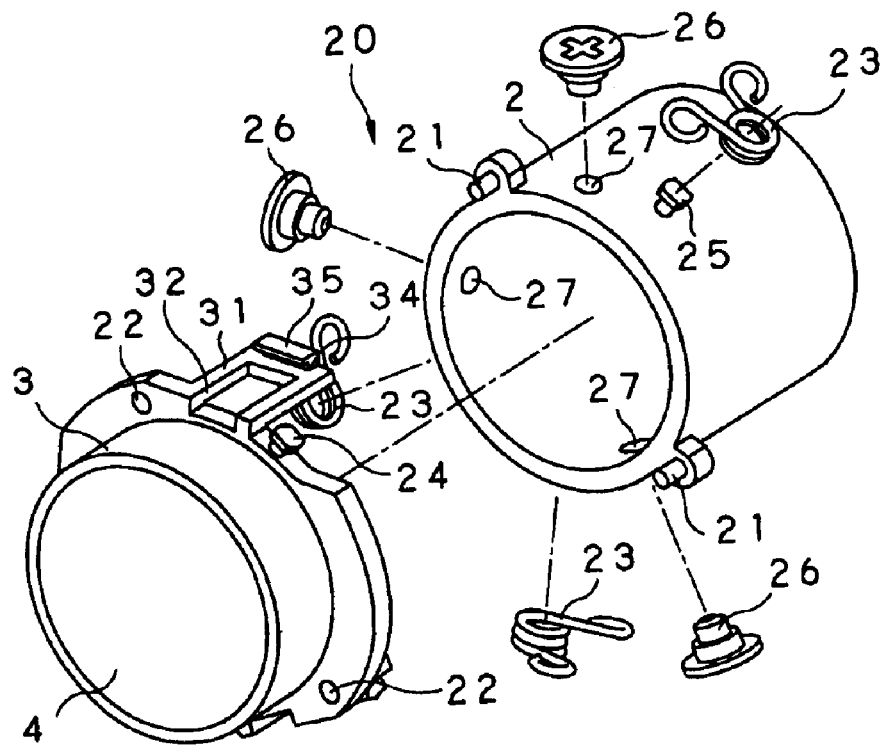
FIG. 7 is an exploded perspective view showing the structure of the lens apparatus.

The lens centering mechanism 20 includes, as support means, a plural number of guide pins 21, provided on one of facing mounting surfaces of the lens holding member 3 and the main body unit of the lens barrel 2, specifically, on the front side of the main body unit of the lens barrel 2, so as to be protruded in a direction parallel to the optical axis, and a plural number of guide holes 22, bored in the other facing mounting surface, specifically, on the back side surface of the lens holding member 3, in a direction parallel to the optical axis and in register with the guide pins 21, as shown in FIGS. 5 to 7. The lens holding member 3 is positioned with respect to the main body unit of the lens barrel 2, within a plane perpendicular to the optical axis, while being carried for sliding along the direction of the optical axis by the plural guide pins 21 intruding into the plural guide holes 22. That is, with the present lens centering mechanism 20, the lens holding member 3 may be slid only along the direction of the optical axis relative to the main body unit of the lens barrel 2.

At least two of the supporting means, composed of the guide pins 21 and the guide holes 22, are provided within a plane perpendicular to the optical axis, on the outer rim of the lens 4 held by the lens holding member 3, in such a manner that the lens holding member 3 is not rotated about the optical axis relative to the main body unit of the lens barrel 2, and also in such a manner that the lens holding member 3 is not moved in a direction perpendicular to the optical axis. Specifically, a pair of the paired supporting means are provided facing to each other on the sites bisecting the outer rim of the lens 4 carried by the lens holding member 3 into two substantially equal portions.

The lens centering mechanism 20 also includes a plural number of torsion coil springs 23, as biasing means for biasing the lens holding member 3, carried for sliding in a direction along the optical axis, towards one side of the direction of the optical axis relative to the main body unit of the lens barrel 2. These plural torsion coil springs 23 are mounted adjacent to adjustment pins 26, as later explained, that is at locations circumferentially trisecting the outer rim of the lens 4 into three substantially equal portions.

Specifically, each torsion coil springs 23 is composed of a wire extended from a coiled portion 23a with a preset spreading angle to both extreme ends which are formed as a pair of retention portions 23b, 23c. One 23b of these retention portions is engaged with a protruding mating retention portion 24 formed on the outer peripheral surface of the lens holding member 3, while the other retention portion 23c is engaged with another protruding mating retention portion 25 formed on the outer peripheral surface of the main body unit of the lens barrel 2. Meanwhile, these protruding mating retention portions 24, 25, paired to each other, are provided along a direction parallel to the optical axis.

The interval between the paired protruding mating retention portions 24, 25 is set so as to be smaller than the distance between the paired retention portions 23b, 23c of the torsion coil spring 23. The torsion coil spring 23 is compressed in this manner and hence biases the lens holding member 3 in a direction away from the main body unit of the lens barrel 2 under the force of recoiling from the compressed state.

The lens centering mechanism 20 also includes, as means for adjusting the tilt of the lens 4 held by the lens holding member 3, a plural number of adjustment pins 26, rotatably mounted on at least three sites on the outer peripheral surface of the main body unit of the lens barrel 2. The adjustment pins 26 are mounted at the locations trisecting the outer rim of the lens 4 held by the lens holding member 3 into three substantially equal portions along the circumferential direction.

Figure 8:
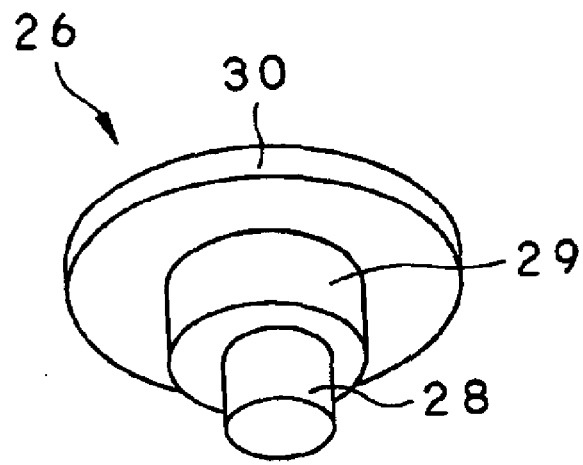
FIG. 8 is a perspective view showing an adjustment pin of the lens centering mechanism of FIG. 5, looking from the underside.
Figure 9:
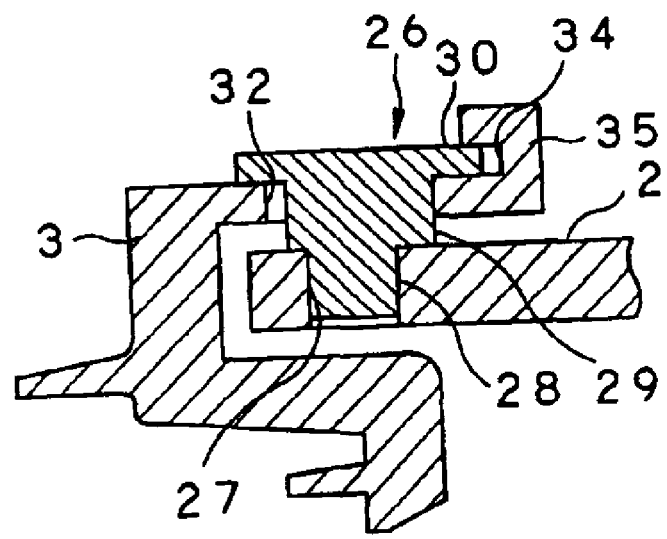
FIG. 9 is a cross-sectional view showing essential portions of the lens centering mechanism shown in FIG. 5.

Specifically, each adjustment pin 26 includes a pivot shaft 28 engaged in a shaft opening 27 formed in the outer peripheral surface of the main body unit of the lens barrel 2, and is rotationally carried by the outer peripheral surface of the main body unit of the lens barrel 2 by the engagement of the pivot shaft 28 in the shaft opening 27, as shown in FIGS. 5, 8 and 9.

The respective adjustment pins 26 each include an offset portion 29, offset with respect to the pivot shaft 28, and a flanged portion 30 protruded in a radius increasing direction from the end of the offset portion 29.

The offset portion 29 is offset with respect to the pivot shaft 28, representing the center of rotation of the adjustment pin 26, and has a radius larger than the radius of the pivot shaft 28. A plural number of support pieces 31 are provided for extending in the direction along the optical axis from the outer peripheral surface of the main body unit of the lens barrel 2. These support pieces 31 are each formed with an engagement hole 32 engaged by the offset portion 29 of the adjustment pin 26. This engagement hole 32 is an oblong hole extending along the optical axis and is slightly larger in width than the outer diameter of the offset portion 29 in order to permit the offset portion 29 to be rotated within the hole. Since the lens holding member 3 is biased by the torsion coil spring 23 in a direction in which the lens holding member 3 is spaced apart from the main body unit of the lens barrel 2, the offset portion 29 is abutted against the rear side extreme end of the engagement hole 32.

The flanged portion 30 has a diameter slightly larger than the width of the engagement hole 32 and a recess in the form of a plus sign 33, for example, is formed in the upper surface of the flanged portion 30 in order to permit rotation of the adjustment pin 26 by a jig, such as a screwdriver. The rear end of each support piece 31 towards the rear side extreme end of the engagement hole 32 is formed with an L-shaped portion 35 defining with the support piece 31 a groove 34 partially engaged by the flanged portion 30. Thus, the adjustment pin 26 is prevented from being disengaged from the engagement hole 32 by the flanged portion 30 partially engaging with the groove 34.

In the above-described lens centering mechanism 20, when each adjustment pin 26 is rotated about the pivot shaft 28, the offset portion 29 engaged in the engagement hole 32 of the lens holding member 3 is rotated to change over the offset position of the offset portion 29. At this time, the the lens holding member 3 is biased by the torsion coil spring 23 in a direction away from the main body unit of the lens barrel 2. Thus, the offset portion 29 is abutted against the rear surface side extreme end of the engagement hole 32. The lens holding member 3 may be displaced in a direction along the optical axis by changing over the offset position of the offset portion 29 engaging in the engagement hole 32. Since the adjustment pins 26 are provided on the sites trisecting the circumference of the lens 4 held by the lens holding member 3 into three substantially equal portions along the circumferential direction, the lens 4 held by the lens holding member 3 may be adjusted to an optional tilted position by independently displacing the lens holding member 3 in a direction along the optical axis by the adjustment pins 26.

Moreover, in this lens centering mechanism 20, in which the torsion coil spring 23 biases the lens holding member 3 in a direction away from the main body unit of the lens barrel 2, the flanged portion 30 is engaged with the groove 34 of the lens holding member 3 when the offset portion 29 engaging in the engagement hole 32 abuts against the end of the engagement hole 32, as shown in FIGS. 3, 4 and 9. This prohibits the adjustment pin 26 from being withdrawn from the engagement hole 32 of the adjustment pin 26.

Figure 10:
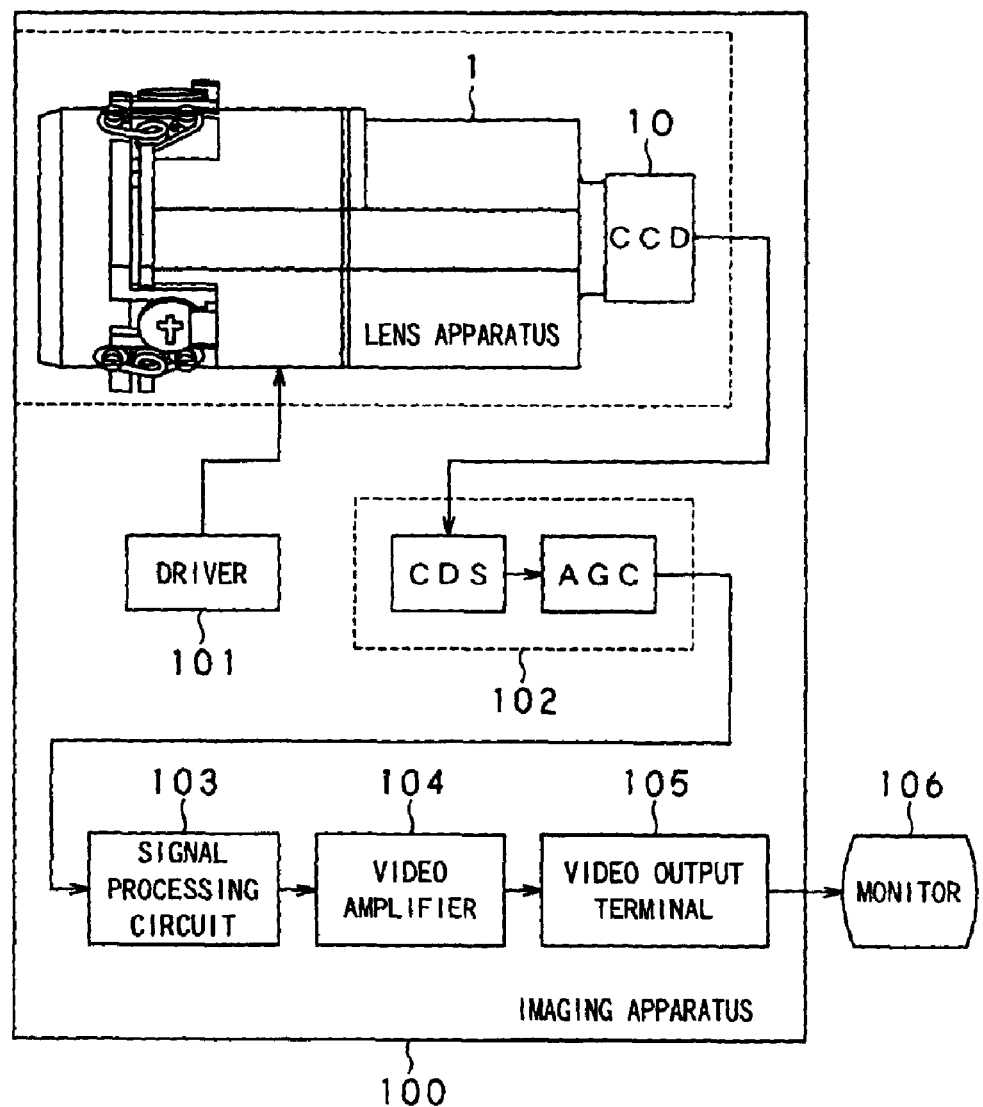
FIG. 10 is a block diagram showing the structure of an imaging apparatus embodying the present invention.

An imaging apparatus 100, embodying the present invention, is now explained with reference to FIG. 10.

The imaging apparatus 100 includes, in addition to the lens apparatus 1, a driver 101 for actuating the set of movable lenses for zooming 5 and the set of movable lenses for focussing 7 of the lens apparatus 1 in a direction along the optical axis and for adjusting the opening degree of the iris stop 8. An image of an object, formed by the lens apparatus 1, actuated by the driver 101, is received by the solid-state imaging device 10, and the light received by this solid-state imaging device 10 is photoelectrically transduced to form output analog image signals.

The analog image signals, output from the solid-state imaging device 10, are sent to a pre-processing circuit 102. In this pre-processing circuit 102, the noise is reduced by CDS (correlative double sampling), while the gain is adjusted by AGC (auto gain control).

The analog image signals, thus processed, are converted into digital image signals, by an A/D converter, not shown, and are sent to a signal processing circuit 103. The signal processing circuit 103 performs luminance and chroma processing on the digital image signals to generate digital image data corresponding to the object image. The so generated digital image data is converted by a D/A converter, not shown, into analog image data, which is output via a video amplifier 104 as analog video signals at a video output terminal 105. These analog video signals are displayed on a monitor 106 connected to the video output terminal 105.

Meanwhile, the digital image data, generated by the aforementioned signal processing circuit 103, may be stored in a memory, or may be output to the signal processing circuit 103 from the memory, by a reverse route, under control by a system controller, not shown.

Figure 11:
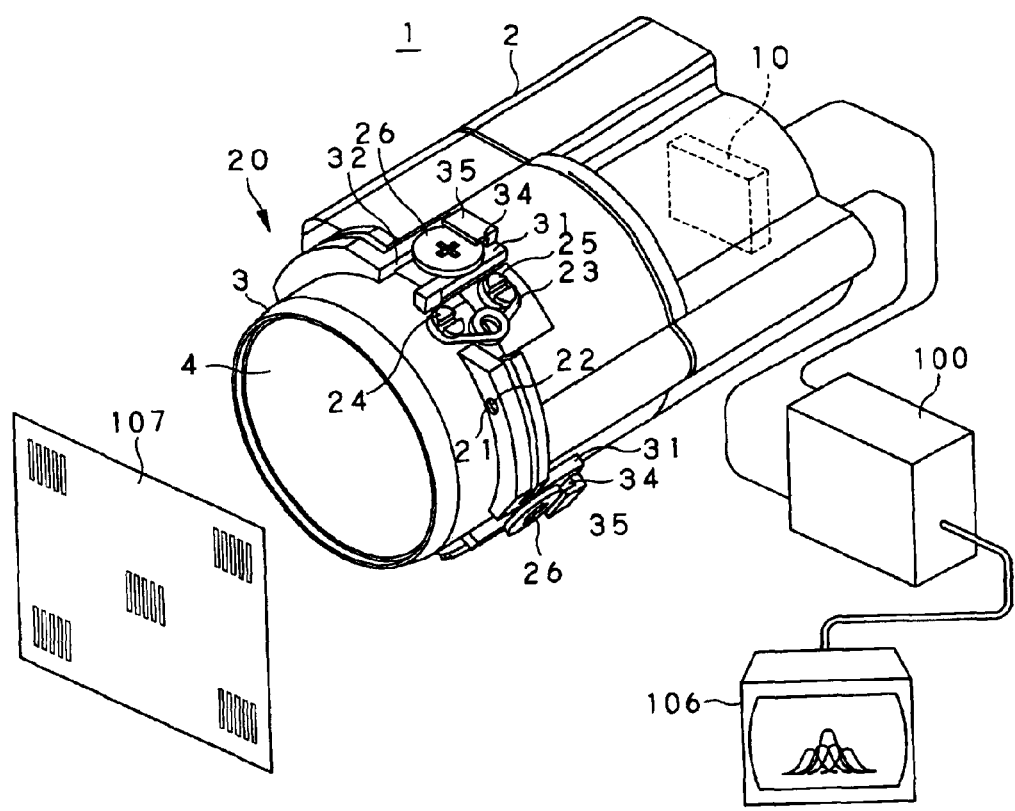
FIG. 11 is a perspective view for illustrating the centering operation of the lens apparatus.

It should be noted that, in the present imaging apparatus 100, when the centering operation of the lens 4, held by the lens holding member 3, is to be performed by the lens centering mechanism 20 of the lens apparatus 1, an image of a resolution chart 107, shown in FIG. 11, is formed on the solid-state imaging device 10, and an image of the chart picked up by the solid-state imaging device 10 is processed to form video signals. The tilt of the lens 4, held by the lens holding member 3, is adjusted as the image of the chart, projected on the monitor 106 based on the video signals output from the solid-state imaging device 10, is checked.

Figure 12:
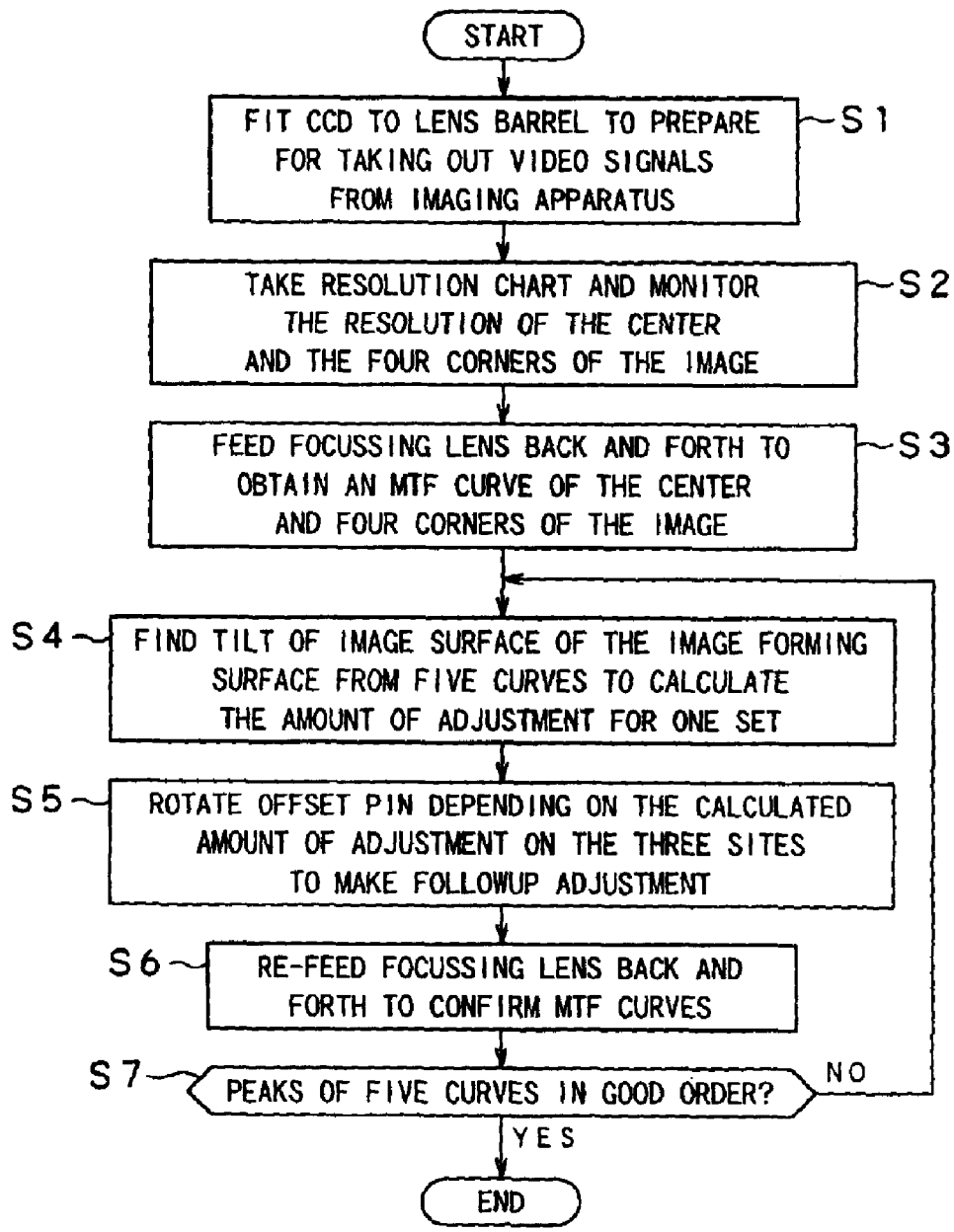
FIG. 12 is a flowchart for illustrating the centering operation of the lens apparatus.

The centering operation for the lens 4 by the aforementioned lens centering mechanism 20 is now explained with reference to the flowchart shown in FIG. 12.

First, in a step S1, the solid-state imaging device 10 is mounted on the main body unit of the lens barrel 2, while preparations are made for taking out video signals of the chart 107 by the imaging apparatus 100 connected to this solid-state imaging device 10.

In the next step S2, the resolution chart 107 is imaged by the solid-state imaging device 10, and an image of the resolution chart 107 thus acquired is processed by the imaging apparatus 100 to check the resolution of the center and the four corners of the image on the solid-state imaging device 10 by the monitor 106.

Figure 13:
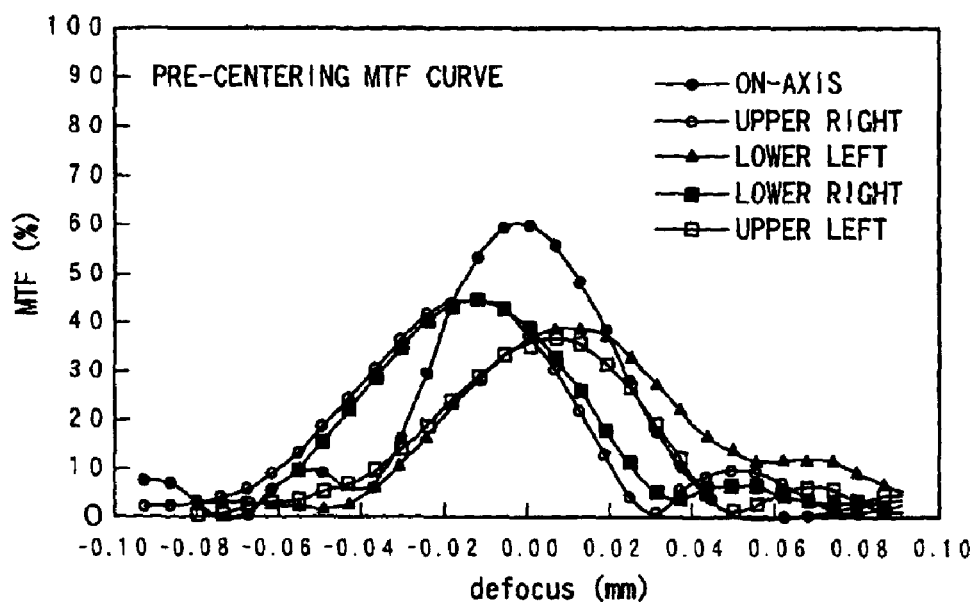
FIG. 13 is a graph showing a defocussing curve of MTF, prior to centering, of the lens apparatus.

In the next step S3, MTF (modulation transfer function) values, indicating the resolution at the center and four corners of the image of the solid-state imaging device 10, shown in FIG. 13, are measured as a defocussing curve corresponding to the defocussing, as the set of movable lenses for focussing 7 of the lens apparatus 1 is moved in a direction along the optical axis by the driver 101.

In the next step S4, the tilt of the image forming surface is found from the peak positions of the five defocussing curves shown in FIG. 13. For correcting this tilt, the amount of adjustment of the three adjustment pins 26 is calculated from the tilt of the first set of fixed lenses 4 held by the lens holding member 3.

In the next step S5, the respective adjustment pins 26 are rotated by a jig, in dependence on the calculated amount of adjustment, to adjust the tilt of the lens 4 held by the lens holding member 3.

Figure 14:
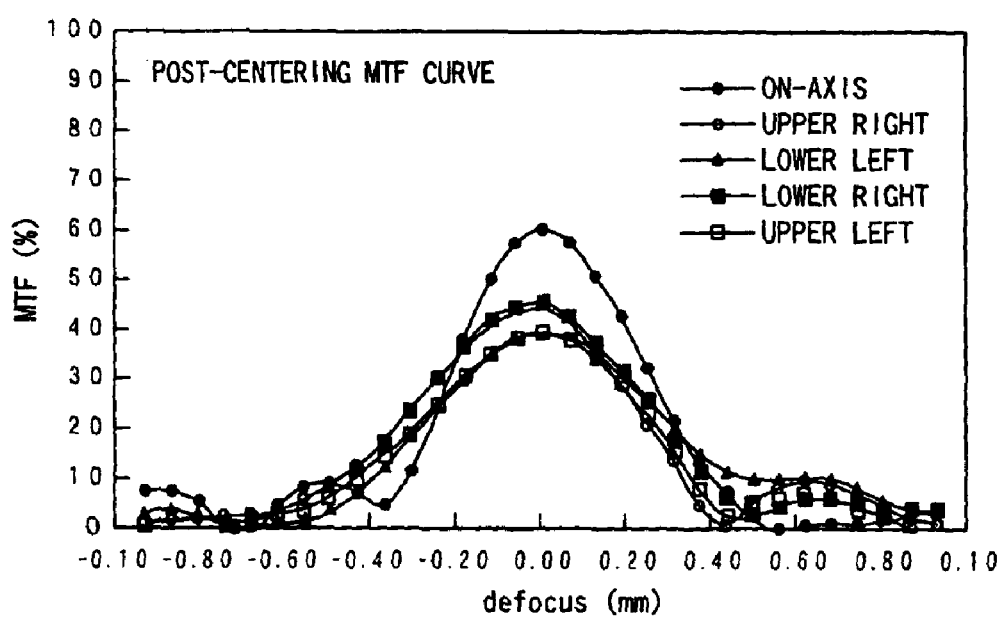
FIG. 14 is a graph showing a defocussing curve of MTF, following centering, of the lens apparatus.

In the next step S6, the defocussing curve indicating the resolution at the center and four corners of the image of the solid-state imaging device 10, shown in FIG. 14, is measured, as the set of movable lenses for focussing 7 of the lens apparatus 1 is again actuated by the driver 101.

In the next step S7, it is checked whether or not the peak positions of the five defocussing curves shown in FIG. 14 are coincident on the image forming surface. In case of coincidence, the centering operation of the lens 4 is terminated. In case of non-coincidence, processing reverts to the step S4 and the centering operation is repeatedly performed until the peak positions of the five defocussing curves coincide on the image forming surface.

Meanwhile, in the above-described lens centering mechanism 20, the centering operation of the lens 4 is performed by rotating the adjustment pins 26 mounted on the outer peripheral surface of the main body unit of the lens barrel 2. In this case, there is no risk of the jig or the operator=s hand being picked up in the image during rotation of the adjustment pins 26, thus assuring the facilitated centering operation. Additionally, the jig used in performing the centering operations may be simpler in structure.

Moreover, the lens centering mechanism 20 may be reduced in size as compared to the conventional mechanism by reducing the degree of swelling out of the outer shape of the main body unit of the lens barrel 2 to as small a value as possible. Thus, with the lens apparatus 1 and the imaging apparatus 100, provided with this lens centering mechanism 20, the overall size of the apparatus may be reduced further.

Additionally, with the lens apparatus 1 and the imaging apparatus 100, provided with this lens centering mechanism 20, there is only little risk of intrusion of component parts, such as set screws or plate springs, into the inside of the main body unit of the lens barrel 2 during adjustment. Since set screws for securing the lens holding member 3 to the main body unit of the lens barrel 2 are unneeded, the number of operating steps may be reduced as a result of reduction in the number of component parts, thus further reducing the cost.

A modification of the above-described lens centering mechanism 20 is hereinafter explained.

Figure 15:
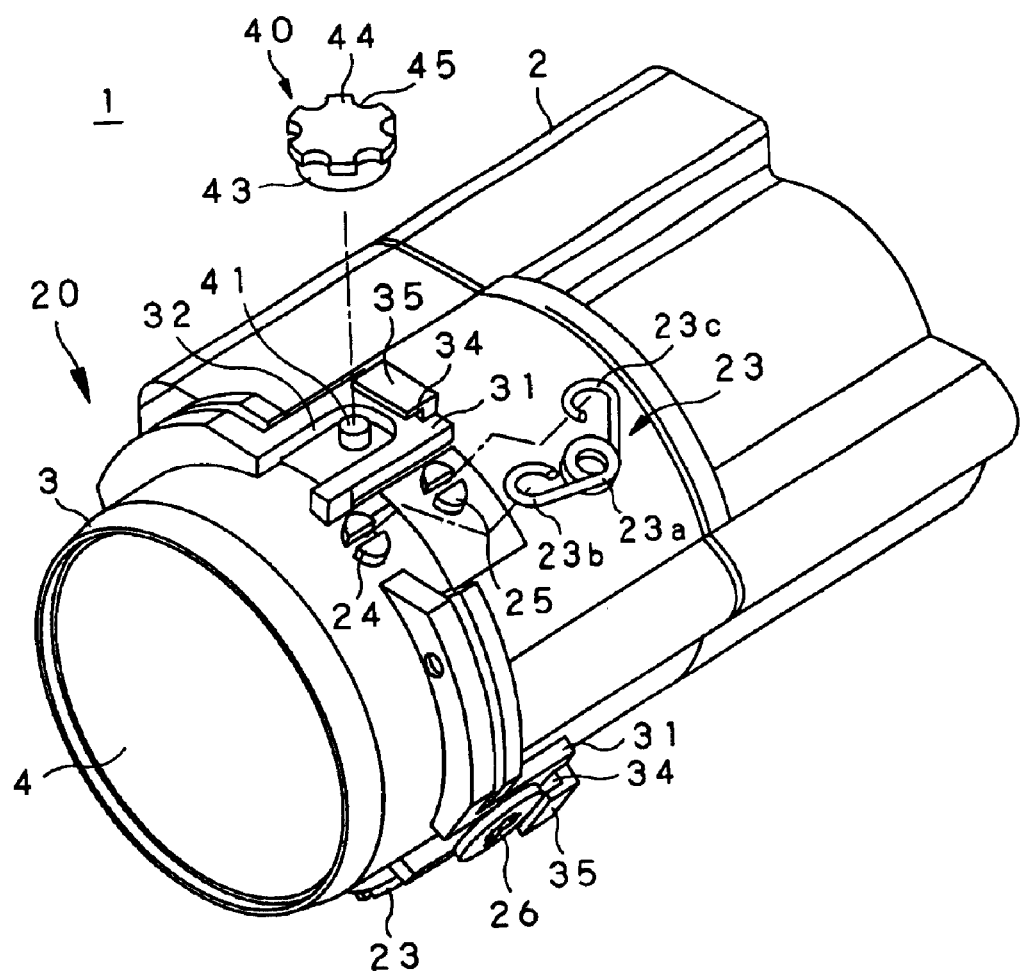
FIG. 15 is an exploded perspective view showing a modification of the lens centering mechanism provided to the lens apparatus.
Figure 16:
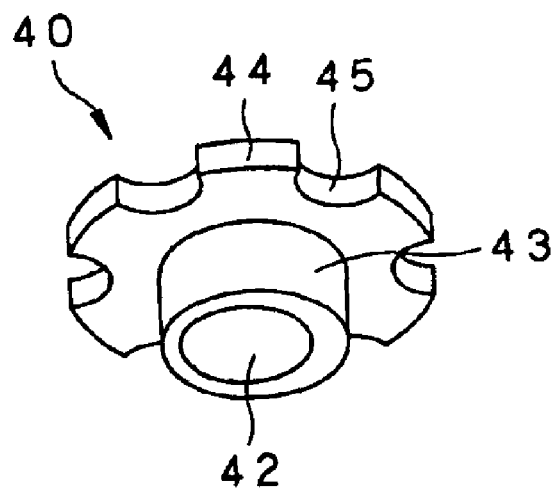
FIG. 16 is a perspective view of an adjustment pin of the lens centering mechanism of FIG. 15, looking from the underside.
Figure 17:
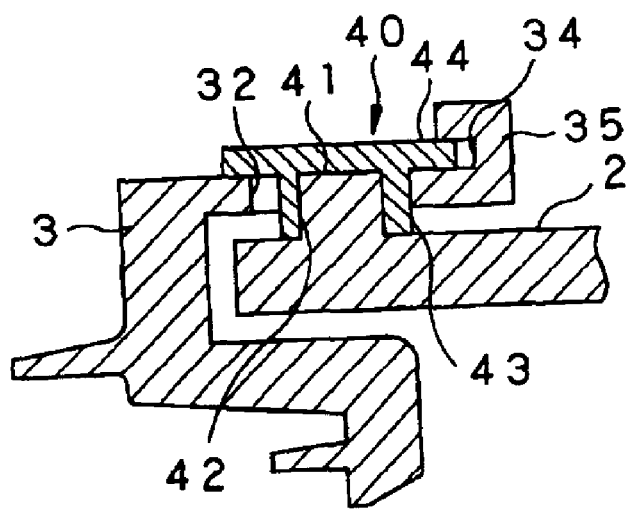
FIG. 17 is a cross-sectional view showing essential portions of the structure of the lens centering mechanism shown in FIG. 15.

The lens centering mechanism 20, shown in FIG. 15, includes, as adjustment means for adjusting the tilt of the lens 4 held by the lens holding member 3, a plural number of adjustment pins 40, rotatably mounted on at least three sites on the outer peripheral surface of the main body unit of the lens barrel 2, in place of the aforementioned adjustment pins 26. These adjustment pins 40 are mounted at the locations on the outer peripheral surface of the lens 4, held by the lens holding member 3, which trisect the outer peripheral surface into three substantially equiangular portions along the circumferential direction.

More specifically, each adjustment pin 40 has a shaft hole 42, in which is engaged a pivot shaft 41 provided on the outer peripheral surface of the main body unit of the lens barrel 2, and is rotationally carried by the outer peripheral surface of the main body unit of the lens barrel 2 by engagement of the pivot shaft 41 in the shaft hole 42. Moreover, each adjustment pin 40 includes an offset portion 43, offset relative to the rotational center of the adjustment pin 40, and a flanged portion 44, protruded from the end of the offset portion 43 in a direction of increasing the radius of the offset portion 43. The adjustment pin 40 may be prevented from being withdrawn from the engagement hole 32 by the offset portion 43 engaging in the engagement hole 32 of the lens holding member 3 and by the flanged portion 44 partially engaging in the groove 34 of the lens holding member 3.

In the outer periphery of the flanged portion 44 are formed a plural number of cut-outs 45, in place of the recess in the form of a plus sign 33, for allowing the operation of rotating the adjustment pin.

Thus, when the adjustment pins 40 are rotated about the pivot shafts 40 as the center of rotation, as the offset portions 43 are engaged in the engagement holes 32 of the lens holding member 3, the offset portions 43, engaging in the engagement holes 32 of the lens holding member 3, are rotated to change over the offset positions of the offset portions 43. At this time, the lens holding member 3 is biased by the torsion coil springs 23 in the direction away from the main body unit of the lens barrel 2. Consequently, the offset portions 43 are abutted against the rear surface side ends of the engagement holes 32 to change over the offset positions of the offset portions 43, engaging in the engagement holes 32 of the lens holding member 3, thus displacing the lens holding member 3 in the direction along the optical axis. Since the adjustment pins 40 are provided at the locations which trisect the outer rim part of the lens 4 held by the lens holding member 3 into three substantially equal portions, it is possible to optionally adjust the tilt of the lens 4 held by the lens holding member 3 by displacing the lens holding member 3 along the optical axis by independently acting at the respective locations by the adjustment pins 40, as in the case of the above-mentioned adjustment pins 26.

Figure 18:
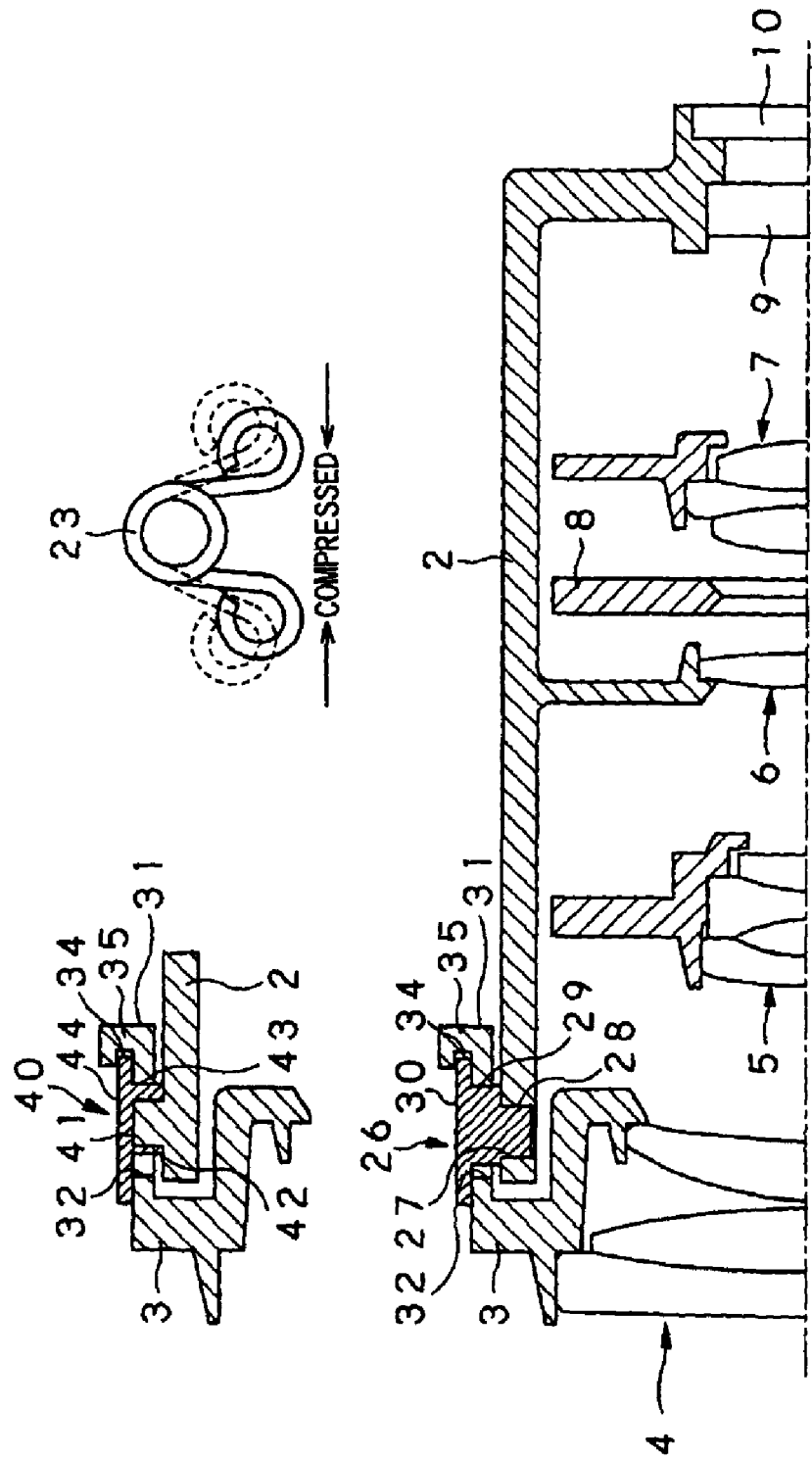
FIG. 18 illustrates the biased stated of a torsion coil spring when the torsion coil spring is used in a compressed state.

Meanwhile, if, in the above-described torsion coil springs 23, the spacing between the paired protruding mating retention portions 24, 25 is narrower than the spacing between the paired retention portions 23b, 23c, the torsion coil springs 23 are compressed when the paired retention portions 23b, 23c are retained by the paired protruding mating retention portions 24, 25, as shown in FIG. 18.

Since the torsion coil springs 23 then bias the lens holding member 3 in a direction away from the main body unit of the lens barrel 2, by the elastic recoiling force from the compressed state, the adjustment pins 26 and the adjustment pins 40 are both abutted against the back side ends of the engagement holes 32.

Figure 19:
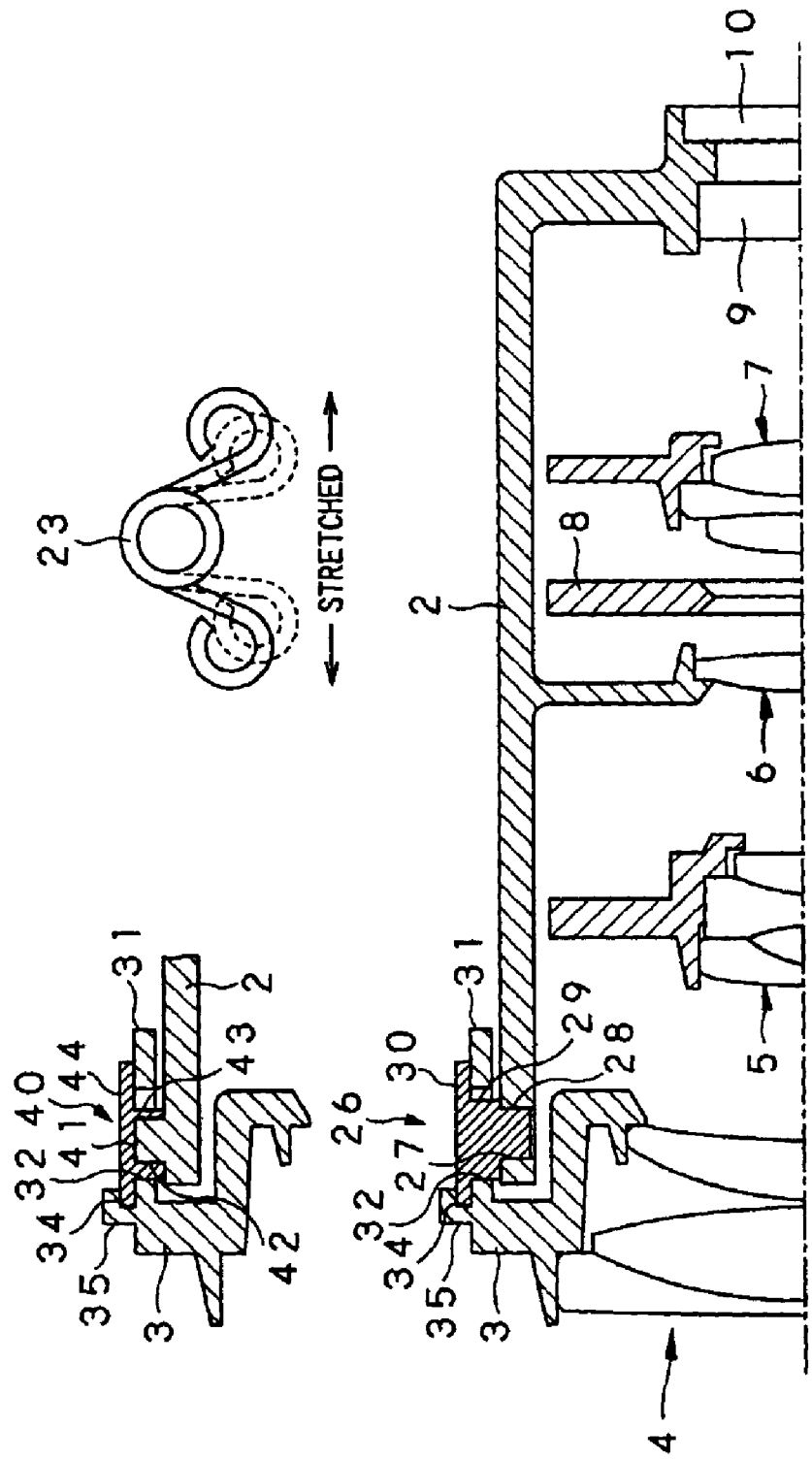
FIG. 19 illustrates the biased stated of a torsion coil spring when the torsion coil spring is used in a tensioned state.

If conversely the spacing between the paired protruding mating retention portions 24, 25 is broader than the spacing between the paired retention portions 23b, 23c of the torsion coil springs 23, the torsion coil springs 23 are stretched when the paired retention portions 23b, 23c are retained by the paired protruding mating retention portions 24, 25, as shown in FIG. 19.

Since the torsion coil springs 23 then bias the lens holding member 3 in a direction approaching to the main body unit of the lens barrel 2, under the elastic recoiling force from the stretched state, the adjustment pins 26 and the adjustment pins 40 are both abutted against the forward side ends of the engagement holes 32.

In case the torsion coil springs 23 are used in the stretched state, an L-shaped piece 35, defining a groove 34, in which are engaged the flanged portions 30, 44 of the adjustment pins 26, 40, is provided at a forward side end of the engagement hole 32 of each support piece 31 of the lens holding member 3, as shown in FIG. 19.

By way of comparison, if the torsion coil springs 23 are used in the stretched state, the external force, that may be applied to the lens holding member 3 from the front end side, may be received by the adjustment pins 26, 40.

If the adjustment pins 26 and the adjustment pins 40 are compared to each other, the point of action on which acts the bias force by the torsion coil spring 23 coincides with the fulcrum point, in the case of the adjustment pins 40, so that it is possible to prevent the generation of the moment of force due to the above-mentioned bias force.

It should be noted that the lens centering mechanism 20 is not limited to a structure in which the protruding retention portions 24 on the outer peripheral surface of the lens holding member 3 and the protruding retention portions 25 on the outer peripheral surface of the main body unit of the lens barrel 2 are arranged in a direction along the optical axis. For example, the paired protruding mating retention portions may be offset about the optical axis.

In this case, the force of bias acting to bias the lens holding member 3 towards one side of the optical axis with respect to the main body unit of the lens barrel 2 as well as the force of bias acting to bias the lens holding member 3 in a direction perpendicular to the optical axis with respect to the main body unit of the lens barrel 2 is generated by retention of the paired retention portions 23b, 23c of the torsion coil springs 23 by the paired protruding mating retention portions 24, 25.

Thus, the guide pins 21, forming the support means, are thrust against the guide holes 22, in a direction perpendicular to the slide direction, thus enabling prevention of backlash of the lens holding member 3 positioned relative to the main body unit of the lens barrel 2.

Figure 20:
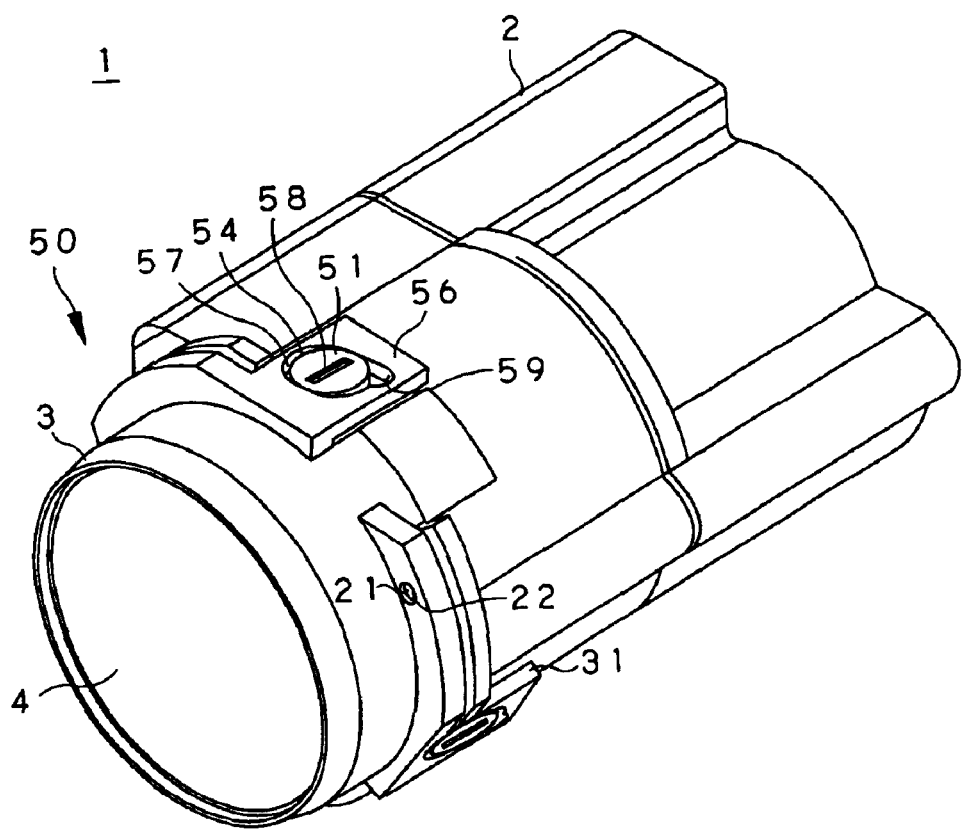
FIG. 20 is a perspective view showing the appearance of another illustrative structure of the lens centering mechanism provided to the lens apparatus.
Figure 21:
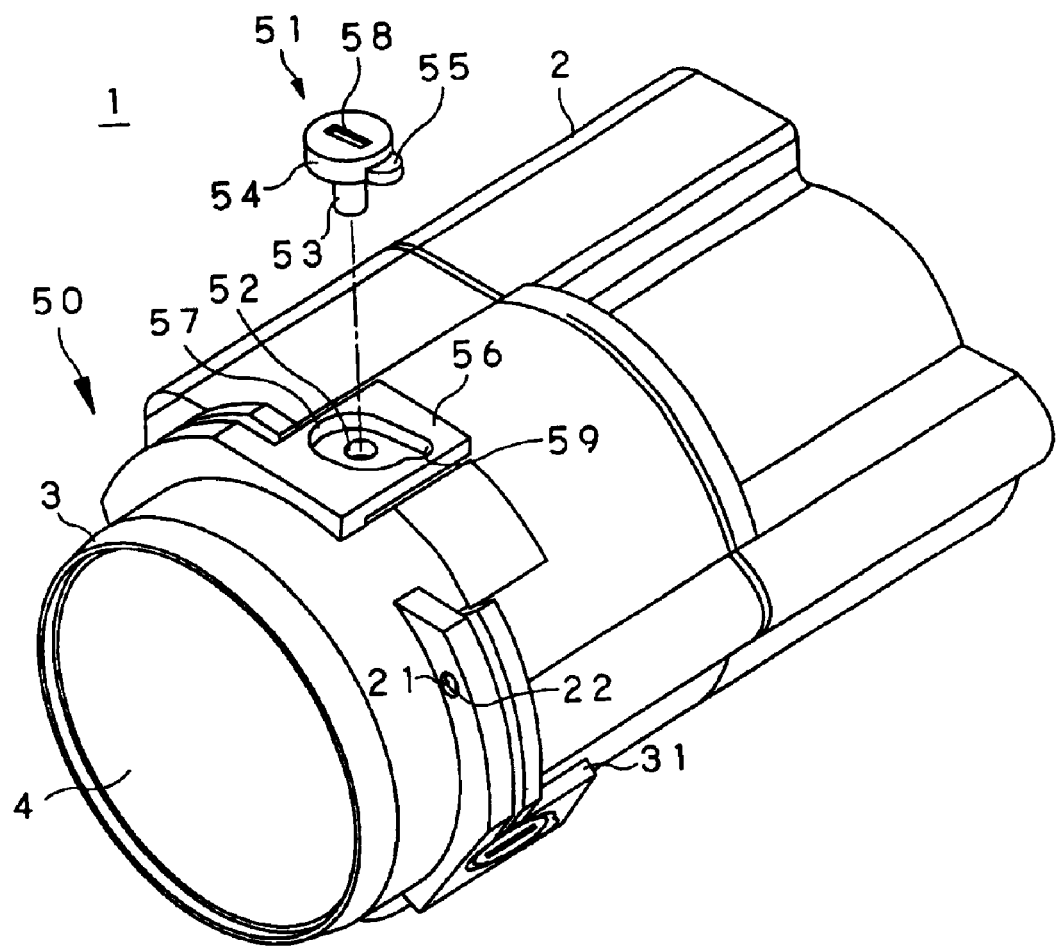
FIG. 21 is an exploded perspective view showing still another illustrative structure of the lens centering mechanism provided to the lens apparatus.

As another illustrative structure of the lens centering mechanism embodying the present invention, a lens centering mechanism 50, provided to the lens apparatus 1 shown in FIGS. 20 and 21, is now explained.

Figure 22:
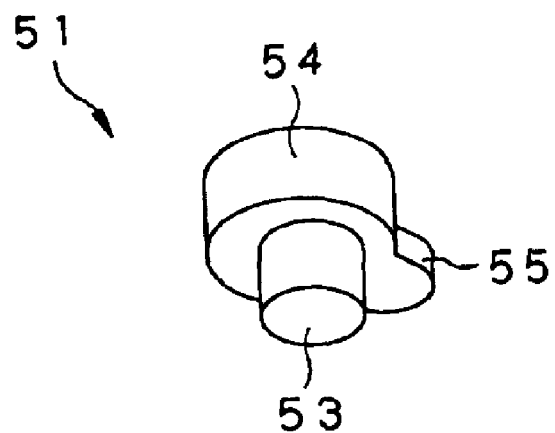
FIG. 22 is a perspective view showing an adjustment pin of the lens centering mechanism of FIG. 20, looking from the underside.

In the lens centering mechanism 50, shown in FIGS. 20 and 22, the parts or components similar to those of the lens centering mechanism 20 shown in FIGS. 3 and 5 are not explained and depicted by the same reference numerals as those used in FIGS. 3 and 5.

The lens centering mechanism 50 includes, as means for adjusting the tilt of the lens 4 held by the lens holding member 3, a plural number of adjustment pins 51, provided at least on three sites on the outer peripheral surface of the main body unit of the lens barrel 2. These adjustment pins 51 are provided at the locations which trisect the outer rim part of the lens 4 held by the lens holding member 3 into three substantially equal portions.

Figure 23:
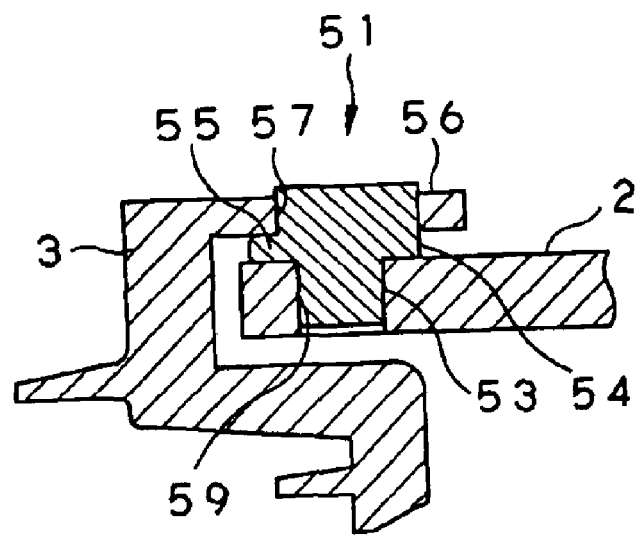
FIG. 23 is a cross-sectional view showing the structure of the lens centering mechanism shown in FIG. 20.

Specifically, the respective adjustment pins 51 each include a pivot shaft 53 engaging in a shaft hole 52 formed in the outer peripheral surface of the main body unit of the lens barrel 2, and is rotationally carried by the outer peripheral surface of the main body unit of the lens barrel 2 by the pivot shaft 53 engaging in the shaft hole 52, as shown in FIGS. 21 to 23.

Each adjustment pin 51 includes an offset portion 54, offset relative to the pivot shaft 53, and a tongue 55, protruded from the outer rim of the offset portion 54.

The offset portion 54 is offset with respect to the pivot shaft 53 representing the center of rotation of the adjustment pin 26, and has a radius larger than the radius of the pivot shaft 53. A plural number of support pieces 56 are provided for extending in the direction along the optical axis from the outer rim of the main body unit of the lens barrel 2. These support pieces 56 are each formed with an engagement hole 57 engaged by the offset portion 54 of the adjustment pin 51. This engagement hole 57 is of a width in the direction along the optical axis which is approximately coincident with the outer diameter of the offset portion 54 and of a width in the direction perpendicular to the optical axis which is slightly broader than the outer diameter of the offset portion 54, in order to permit rotation of the offset portion 54 within the hole and in order to permit clinching of the outer rim of the offset portion 54 from the direction parallel to the optical axis. In the upper surface of each adjustment pin 51 is formed e.g., a groove in the form of a minus sign 58 in order to permit rotation of the adjustment pin 26 by a jig, such as a driver.

The tongue 55 serves for preventing withdrawal of the adjustment pin 51 from the engagement hole 57, and is formed so as to be protruded from the outer rim of the lower end side of the offset portion 54 in a radius enlarging direction. The tongue 55 has a thickness corresponding to a gap defined between the support piece 56 and the outer peripheral surface of the main body unit of the lens barrel 2, and has its foremost part rounded to permit facilitated intrusion of the tongue 55 into the gap defined between the lens holding member 3 and the main body unit of the lens barrel 2. On the other hand, the support piece 56 has the inner lateral surface defining the engagement hole 57 partially cut off to form a cut-out 59 adapted for mating with the tongue 55. When the respective adjustment pins 51 are rotated about the pivot shafts 53 as the center of rotation, the offset portions 54 are rotated, as the offset portions 54 are abutted against both ends along the optical axis of the engagement holes 57, that is the forward and rear sides of the engagement holes 57, extending parallel to each other and which delimit the engagement holes 57, thus changing over the offset positions of the offset portions 54.

Thus, with the present lens centering mechanism 50, the lens holding member 3 may be displaced in the direction along the optical axis by changing over the offset position of the offset portions 54 engaged in the engagement holes 57. Since the adjustment pins 51 are provided at the locations substantially trisecting the outer rim of the lens 4 held by the lens holding member 3 along the circumferential direction, the lens 4 carried by the lens holding member 3 may be optionally adjusted for tilt by displacing the lens holding member 3 at the respective positions by acting on the adjustment pins 51 independently of one another in the direction along the optical axis.

Figure 24:
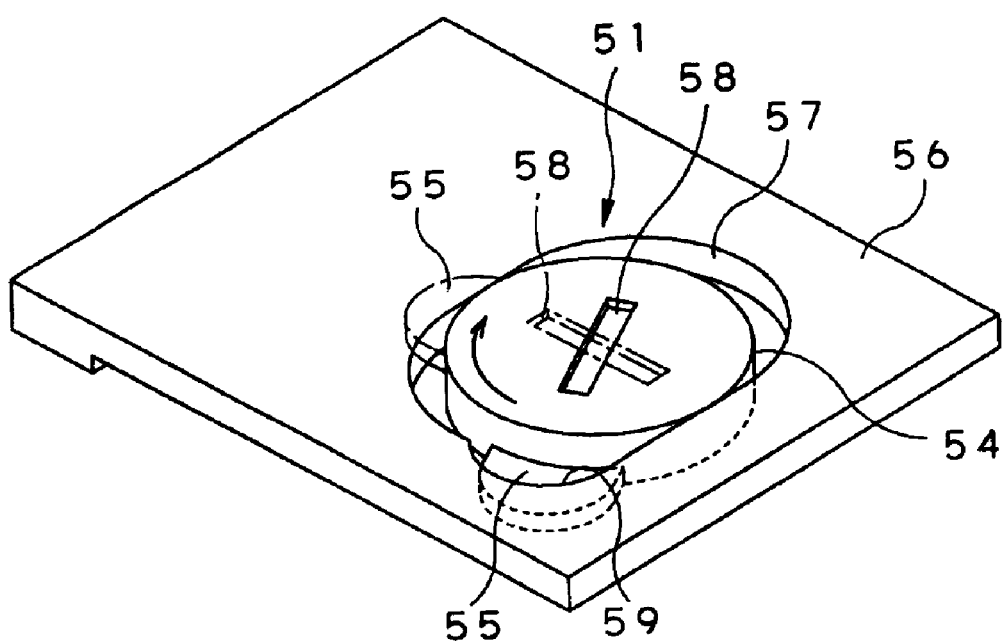
FIG. 24 is a perspective view showing the manner of preventing withdrawal of the adjustment pin of the lens centering mechanism shown in FIG. 20.

Moreover, with the present lens centering mechanism 50, the tongue 55 is intruded into a gap between the lens holding member 3 and the main body unit of the lens barrel 2, by changing over the offset position of the offset portion 54, engaged in the engagement hole 57, as shown in FIGS. 23 and 24. This prevents withdrawal of the adjustment pin 51 from the engagement hole 57.

Thus, with the present lens centering mechanism 50, the torsion coil springs 23 of the lens centering mechanism 20 are unneeded, so that the number of component parts and the number of assembling steps may be diminished to achieve further reduction in costs.

Moreover, with the present lens centering mechanism 50, the centering operation for the lens 4 is carried out by rotating the adjustment pins 51, mounted on the outer peripheral surface of the main body unit of the lens barrel 2, as in the lens centering mechanism 20, described above.

Consequently, with the present lens centering mechanism 50, there is no risk of e.g. the jig or the operator=s hand being picked up into an image, thus assuring a facilitated centering operation. Additionally, the jig used in the centering operation may be simplified in structure.

Furthermore, the present lens centering mechanism 50 may be smaller in size than a conventional mechanism by suppressing the swelling out of the outer shape of the main body unit of the lens barrel 2 to the smallest possible value. Thus, with the lens apparatus 1 and the imaging apparatus 100, provided with the lens centering mechanism 50, the overall apparatus may be further reduced in size.

On the other hand, with the lens apparatus 1 and the imaging apparatus 100, provided with the lens centering mechanism 50, the set screws or plate springs, for example, are not liable to be intruded into the inside of the main body unit of the lens barrel 2, during adjustment, such that there is only little risk of component parts being picked up in the image. Moreover, since e.g. the set screws for securing the lens holding member 3 to the main body unit of the lens barrel 2 are unneeded, the number of the process steps may be diminished by reducing the number of component parts, thus achieving further cost reduction.

If, in the above-described lens centering mechanism 20, the lens 4, held by the lens holding member 3, is adjusted for tilt in the absence of the torsion coil springs 23, the lens holding member 3 is biased by e.g. a jig in a direction towards and away from the main body unit of the lens barrel 2. By so doing, the offset portions 29, 43, engaged in the engagement holes 32, are abutted against the rear or forward side ends of the engagement hole 32. From this state, the adjustment pins 26, 40 are rotated and, as the offset positions of the offset portions 29, 43, engaged in the engagement holes 32, are changed over, the lens holding member 3 is displaced in the direction along the optical axis to adjust the tilt of the lens 4 held by the lens holding member 3. After such adjustment, the engaging portions of the adjustment pins 26, 40 and the engagement holes 32 are coated with an adhesive, which then is cured in situ to secure the lens holding member 3 in position relative to the main body unit of the lens barrel 2.

Since the torsion coil springs 23 are unneeded, as in the case of the lens centering mechanism 50, a further cost reduction may be achieved by reducing the number of component parts and the number of the process steps.

In the present invention, the lens holding member 3 may be bonded and secured to the main body unit of the lens barrel 2 by coating an adhesive to the engagement portions between the adjustment pins 26, 40 and 51 and the engagement holes 32, 57 and allowing the so coated adhesive to be cured in situ, after the centering operation by the aforementioned lens centering mechanisms 20, 50. If need be, the lens holding member 3 may be secured to part or all of the outer peripheral surface of the lens holding member 3 and cured in situ in order to secure the lens holding member 3 to the main body unit of the lens barrel 2. Or, the lens holding member 3 may be secured to the main body unit of the lens barrel 2 by mechanical securing means, such as set screws, after the aforementioned centering operation by the lens centering mechanisms 20, 50.

As the adhesive, rapid bonding adhesives of, for example, the cyanuacrylic adhesive, exhibiting superior low-temperature characteristics and quick drying performance, may be used considering that the adhesive is injected at room temperature and also taking the curing time following the injection into account. As the adhesive, the UV curable resins may be used. In this case, the adhesive may be quickly cured on illumination of UV light following the coating in order to reduce the time needed for bonding.

According to the present invention, the aforementioned structure of the adjustment means may be reversed, that is, the aforementioned plural adjustment pins 26, 40 and 51 may be rotationally mounted on at least three sites on the outer rim of the lens holding member 3, while the plural support pieces 31, 56, extending in the direction along the optical axis along the outer peripheral surface of the lens holding member 3, may be protuberantly formed from the outer rim of the main body unit of the lens barrel 2, and the plural engagement holes 32, 57, engaged by the offset portions 29, 43, 54 of the adjustment pins 26, 40 and 51, may be formed in the support pieces 31, 56.

In such case, the lens holding member 3 may similarly be displaced in the direction along the optical axis, with respect to the main body unit of the lens barrel 2, by rotating the adjustment pins 26,40 and 51 mounted on at least three sites on the outer peripheral surface of the lens holding member 3, for adjusting the tilt of the lens 4 held by the lens holding member 3.

The arrangement or the number of the adjustment pins 26 or the torsion coil springs 23 may be changed as necessary. With the present embodiment, the three adjustment pins 26 and the three torsion coil springs 23 are mounted at the locations which substantially trisect the outer peripheral surface of the lens 4, held by the lens holding member 3, in three substantially equal portions of the outer rim of the lens 4 held by the lens holding member 3, in order to provide for facilitated centering operations to the highest efficiency despite the small number of component parts used.

According to the present invention, the structure of the support means may also be reversed, that is, the plural guide pins 21 extending in a direction parallel to the optical axis may be mounted on the back side surface of the lens holding member 3, representing a mounting surface of the lens holding member 3 facing a mounting surface of the main body unit of the lens barrel 2, whilst the plural guide holes 22 may be bored in a direction parallel to the optical axis in the front side surface of the main body unit of the lens barrel 2, representing the mounting surface of the main body unit of the lens barrel 2.

In such case, the plural guide pins 21 are passed through the plural guide holes 22 for positioning the lens holding member 3 relative to the main body unit of the lens barrel 2 within a surface perpendicular to the optical axis, and for supporting the lens holding member 3 for sliding in the direction along the optical axis.

The number of the support means may be three or more. However, in the present embodiment, a pair of support means are provided on the sites substantially bisecting the outer rim of the lens 4 carried by the lens holding member 3, along the circumferential direction, for carrying the lens in utmost stability despite the smallest number of component parts used.

The present invention is not limited to the above-described inner focus type lens apparatus 1 and may also be applied to a single focal point type lens apparatus in which an image of an object is formed by displacing certain preset one(s) of the plural lenses, arranged within the main body unit of the lens barrel, on the common optical axis, in a direction along the optical axis. The present invention may also be applied to an imaging apparatus configured for photographing an image of an object, formed by the lens apparatus, by a solid-state imaging device.

What is claimed is:

1. A centering mechanism for centering a lens held by a lens holding member mounted on a main body unit of a lens barrel, the centering mechanism comprising:

support means for positioning said lens holding member with respect to said main body unit of the lens barrel within a plane perpendicular to an optical axis of said lens and for carrying said lens holding member for movement in a direction along the optical axis; and adjustment means including a plurality of adjustment members, rotationally mounted on at least three sites on an outer peripheral surface of said main body unit of the lens barrel, said adjustment members being rotated to displace said lens holding member in a direction along the optical axis for adjusting a tilt of the lens held by said lens holding member.

2. The lens centering mechanism according to claim 1 wherein each of said plurality of adjustment members includes an offset portion offset relative to a center of rotation thereof, each of said plurality of adjustment members being rotated as said respective offset portion is engaged in an engagement hole provided in an outer rim of said lens holding member to displace said lens holding member in the direction along the optical axis.

3. The lens centering mechanism according to claim 2 wherein each of said plurality of adjustment members further includes a shaft hole engaged by a pivot shaft provided to the outer peripheral surface of said main body unit of the lens barrel and is rotationally mounted on the outer peripheral surface of said main body unit of the lens barrel by engagement of said pivot shaft in said engagement hole.

4. The lens centering mechanism according to claim 2 wherein each of said plurality of adjustment members further includes a pivot shaft engaged in a shaft hole provided in the outer peripheral surface of said main body unit of the lens barrel and is rotationally mounted on the outer peripheral surface of said main body unit of the lens barrel by engagement of said pivot shaft in said engagement hole.

5. The lens centering mechanism according to claim 2 further comprising biasing means for biasing the lens holding member towards one side in the direction along the optical axis.

6. The lens centering mechanism according to claim 5 wherein said biasing means comprises a plurality of torsion coil springs, each having one end retained by the outer peripheral surface of said lens holding member and having another end retained by the outer peripheral surface of said main body unit of the lens barrel, and wherein said lens holding member is biased towards one side in the direction along the optical axis under a force of elasticity of said torsion coil spring.

7. The lens centering mechanism according to claim 5 wherein said adjustment member includes a flanged portion protruded from a site of said offset portion facing outwards from said engagement hole, in a radius enlarging direction, said flanged portion engaging in a groove formed in said lens holding member, as said offset portion is biased by said biasing means towards one side in the direction along the optical axis into abutment against one end of said engagement hole, in such a manner as to prevent withdrawal of said adjustment member from said engagement hole.

8. The lens centering mechanism according to claim 2 wherein each of said plurality of adjustment members further includes a tongue protruded from the outer rim of said offset portion, said tongue intruding into a gap between said lens holding member and the main body unit of the lens barrel, as said offset portion is abutted against front and rear sides of said engagement hole in the direction along the optical axis, in such a manner as to prevent withdrawal of said adjustment member from said engagement hole.

9. The lens centering mechanism according to claim 1 wherein each of said plurality of adjustment members is arranged on the outer peripheral surface of the main body unit of the lens barrel on sites substantially trisecting an outer rim of the lens held by said lens holding member along a circumferential direction thereof.

10. The lens centering mechanism according to claim 1 wherein said support means includes a guide pin provided to one of facing mounting surfaces of said lens holding member and said main body unit of the lens barrel and extends in a direction parallel to the optical axis of said lens, and a guide hole formed in the other of said facing mounting surfaces and extends in the direction parallel to the optical axis of said lens, said guide pin being inserted into said guide hole for positioning said lens holding member relative to said main body unit of the lens barrel in a plane perpendicular to the optical axis of the lens and for supporting the lens holding member for movement in the direction along the optical axis.

11. The lens centering mechanism according to claim 10 wherein said support means is provided on at least two sites of said mounting surface.

12. A lens apparatus comprising:

a plurality of lenses for forming an image of an object;

a lens holding member for holding at least one of said plurality of lenses;

a main body unit of a lens barrel mounting said lens holding member, said main body unit of the lens barrel carrying said plurality of lenses mounted therein on a common optical axis;

support means for positioning said lens holding member with respect to said main body unit of the lens barrel in a plane perpendicular to an optical axis of said lens and for carrying said lens holding member for movement in a direction along the optical axis; and adjustment means including a plurality of adjustment members, rotationally mounted on at least three sites on an outer peripheral surface of said main body unit of the lens barrel, said adjustment members being rotated to displace said lens holding member in a direction along the optical axis for adjusting a tilt of the lens held by said lens holding member.

13. The lens apparatus according to claim 12 wherein each of said plurality of adjustment members includes an offset portion offset relative to a center of rotation thereof, each of said plurality of adjustment members displacing said lens holding member in a direction along the optical axis as each of the plurality of adjustment members is rotated with the offset portion engaging in an engagement hole provided to the outer rim of said lens holding member.

14. The lens apparatus according to claim 13 wherein each of said plurality of adjustment members has a shaft hole engaged by a pivot shaft provided to the outer peripheral surface of the main body unit of the lens barrel and is rotationally mounted to the outer peripheral surface of said main body unit of the lens barrel by engagement of said pivot shaft in said shaft hole.

15. The lens apparatus according to claim 13 wherein each of said plurality of adjustment members has a pivot shaft engaged in a shaft hole provided to the outer peripheral surface of the main body unit of the lens barrel and is rotationally mounted to the outer peripheral surface of the main body unit of the lens barrel by engagement of said pivot shaft in said shaft hole.

16. The lens apparatus according to claim 13 further comprising biasing means for biasing the lens holding member towards one side in the direction along the optical axis.

17. The lens apparatus according to claim 16 wherein said biasing means comprises a plurality of torsion coil springs, each having one end retained by an outer peripheral surface of said lens holding member and having another end retained by the outer peripheral surface of said main body unit of the lens barrel and wherein said lens holding member is biased towards one side in the direction along the optical axis under a force of elasticity of said torsion coil spring.

18. The lens apparatus according to claim 16 wherein each of said plurality of adjustment members includes a flanged portion protruded from a site of said offset portion facing outwards from said engagement hole, in a radius enlarging direction, said flanged portion engaging in a groove formed in said lens holding member, as said offset portion is biased by said biasing means towards one side in the direction along the optical axis into abutment against one end of said engagement hole, in such a manner as to prevent withdrawal of said adjustment member from said engagement hole.

19. The lens apparatus according to claim 13 wherein each of said plurality of adjustment members includes a tongue protruded from an outer rim of said offset portion, said tongue intruding into a gap between said lens holding member and the main body unit of the lens barrel, as said offset portion is abutted against front and rear sides of said engagement hole in the direction along the optical axis, in such a manner as to prevent withdrawal of said adjustment member from said engagement hole.

20. The lens apparatus according to claim 12 wherein each of said plurality of adjustment members is arranged on the outer peripheral surface of the main body unit of the lens barrel on sites substantially trisecting an outer rim of the lens held by said lens holding member into three substantially equal portions along a circumferential direction thereof.

21. The lens apparatus according to claim 12 wherein said support means includes a guide pin provided to one of facing mounting surfaces of said lens holding member and said main body unit of the lens barrel, for extending in a direction parallel to the optical axis of said lens, and a guide hole formed in the other of said facing mounting surfaces, for extending in a direction parallel to the optical axis of said lens, said guide pin being inserted into said guide hole for positioning said lens holding member relative to said main body unit of the lens barrel in a plane perpendicular to the optical axis of the lens and for supporting the lens holding member for movement in the direction along the optical axis.

22. The lens apparatus according to claim 21 wherein said support means is provided on at least two sites of said mounting surface.

23. An imaging apparatus comprising:

a plurality of lenses for forming an image of an object;

a lens holding member for holding at least one of said plurality of lenses;

a main body unit of a lens barrel mounting said lens holding member, said main body unit of the lens barrel carrying said plurality of lenses mounted therein on a common optical axis;

imaging means for photographing an image of an object formed by said lenses;

support means for positioning said lens holding member with respect to said main body unit of the lens barrel in a plane perpendicular to an optical axis of said lens and for carrying said lens holding member for movement in a direction along the optical axis; and adjustment means including a plurality of adjustment members, rotationally mounted on at least three sites on an outer peripheral surface of said main body unit of the lens barrel, said plurality of adjustment members being rotated to displace said lens holding member in the direction along the optical axis for adjusting a tilt of the lens held by said lens holding member.

24. The imaging apparatus according to claim 23 wherein each of said plurality of adjustment members includes an offset portion offset relative to a center of rotation thereof, said adjustment member displacing said lens holding member in a direction along the optical axis as the adjustment member is rotated with the offset portion engaging in an engagement hole provided to an outer rim of said lens holding member.

25. The imaging apparatus according to claim 24 wherein each of said plurality of adjustment members has a shaft hole engaged by a pivot shaft provided to the outer peripheral surface of the main body unit of the lens barrel and is rotationally mounted to the outer peripheral surface of said main body unit of the lens barrel by engagement of said pivot shaft in said shaft hole.

26. The imaging apparatus according to claim 24 wherein each of said plurality of adjustment members has a pivot shaft engaged in a shaft hole provided to the outer peripheral surface of the main body unit of the lens barrel and is rotationally mounted to the outer peripheral surface of said main body unit of the lens barrel by engagement of said pivot shaft in said shaft hole.

27. The imaging apparatus according to claim 24 further comprising biasing means for biasing the lens holding member towards one side in the direction along the optical axis.

28. The imaging apparatus according to claim 27 wherein said biasing means comprises a plurality of torsion coil springs, each having one end retained by the outer peripheral surface of said lens holding member and having another end retained, by the outer peripheral surface of said main body unit of the lens barrel and wherein said lens holding member is biased towards one side in the direction along the optical axis under a force of elasticity of said torsion coil spring.

29. The imaging apparatus according to claim 27 wherein each of said plurality of adjustment members includes a flanged portion protruded from a site of said offset portion facing outwards from said engagement hole, in a radius enlarging direction, said flanged portion engaging in a groove formed in said lens holding member, as said offset portion is biased by said biasing means towards one side in the direction along the optical axis into abutment against one end of said engagement hole, in such a manner as to prevent withdrawal of said adjustment member from said engagement hole.

30. The imaging apparatus according to claim 24 wherein each of said plurality of adjustment members includes a tongue protruded from an outer rim of said offset portion, said tongue intruding into a gap between said lens holding member and the main body unit of the lens barrel, as said offset portion is abutted against front and rear sides of said engagement hole in the direction along the optical axis, in such a manner as to prevent withdrawal of said adjustment member from said engagement hole.

31. The imaging apparatus according to claim 23 wherein said plurality of adjustment members are arranged on the outer peripheral surface of the main body unit of the lens barrel on sites trisecting an outer rim of the lens held by said lens holding member into three substantially equal portions along a circumferential direction thereof.

32. The imaging apparatus according to claim 23 wherein said support means includes a guide pin provided to one of facing mounting surfaces of said lens holding member and said main body unit of the lens barrel, for extending in a direction parallel to the optical axis of said lens, and a guide hole formed in another of said facing mounting surfaces, for extending in a direction parallel to the optical axis of said lens, said guide pin being inserted into said guide hole for positioning said lens holding member relative to said main body unit of the lens barrel in a plane perpendicular to the optical axis of the lens and for supporting the lens holding member for movement in the direction along the optical axis.

33. The imaging apparatus according to claim 32 wherein said support means is provided on at least two sites of said mounting surface.

* * * * *